United States Patent [19]

Tsuchida et al.

[11] Patent Number: 5,691,913
[45] Date of Patent: Nov. 25, 1997

[54] LAYOUT DESIGNING APPARATUS FOR CIRCUIT BOARDS

[75] Inventors: Masayuki Tsuchida; Yukinobu Nishikawa, both of Osaka; Hirokazu Uemura, Yao; Shinji Miura, Kyoto, all of Japan

[73] Assignee: Matsushita Electric Ind. Co., Osaka, Japan

[21] Appl. No.: 410,708

[22] Filed: Mar. 27, 1995

[30] Foreign Application Priority Data

Mar. 28, 1994 [JP] Japan ..................... 6-057361
Oct. 14, 1994 [JP] Japan ..................... 6-249384

[51] Int. Cl.⁶ ............................................. G06F 17/50
[52] U.S. Cl. ............................................. 364/491; 364/488
[58] Field of Search .................................. 364/488, 489, 364/490, 491

[56] References Cited

U.S. PATENT DOCUMENTS

| 4,636,966 | 1/1987 | Yamada et al. | 364/491 |
| 5,187,668 | 2/1993 | Okude et al. | 364/468 |
| 5,200,908 | 4/1993 | Date et al. | 364/491 |
| 5,224,055 | 6/1993 | Grundy et al. | 364/488 |
| 5,297,053 | 3/1994 | Pease et al. | 364/474.24 |
| 5,353,234 | 10/1994 | Takigami | 364/489 |
| 5,475,608 | 12/1995 | Masuoka | 364/491 |
| 5,490,083 | 2/1996 | Toyonaga er al. | 364/489 |
| 5,544,088 | 8/1996 | Aubertine et al. | 364/489 |
| 5,550,750 | 8/1996 | Wolff | 364/491 |

OTHER PUBLICATIONS

"CAD/CAE System Corresponding to High–Function Layout", pp. 13–36, in Electronic Layout Skills, Jul. 1993, vol. 9, No. 7 (with partial translation) [no author info.].

*Primary Examiner*—Kevin J. Teska
*Assistant Examiner*—Leigh Marie Garbowski
*Attorney, Agent, or Firm*—Price, Gess & Ubell

[57] ABSTRACT

A layout designing apparatus for circuit boards including a mother board and a substrate which comprises a layout data storage unit for having areas to store data; an operation unit for giving directions; a mother board setting unit for creating the data about the mother board in the layout data storage unit according to the operation unit; a substrate placement unit for creating the data in the layout data storage unit according to the operation unit so that the substrate of a given configuration is placed on a given place on the mother board; a component placement unit for creating the data in the layout data storage unit according to the operation unit so that components of given configurations are placed on given places on the mother board and on the substrate; a routing unit for creating the data in the layout data storage unit according to the operation unit so that routing paths of given configurations are laid out on the mother board and on the substrate; a display unit; and a layout data display control unit for controlling the display unit to display configurations and places of the mother board, the substrate, components and routing paths as created.

14 Claims, 36 Drawing Sheets

FIG. 3 component list

| component numbers | component names |
|---|---|
| IC1 | MN10 |
| IC2 | MN20 |
| IC3 | MN20 |
| IC4 | AB80 |
| IC5 | MN10 |
| IC6 | MN30 |
| CN1 | CNCT3 |
| CN2 | CNCT3 |

FIG. 4 net

| net names | component numbers-terminal names |
|---|---|
| net1 | CN1-P1,IC1-P1 |
| net2 | CN1-P2,IC1-P2 |
| net3 | CN1-P3,IC4-P1 |
| net4 | IC1-P4,IC2-P1 |
| net5 | IC1-P5,IC2-P2 |
| net6 | IC1-P6,IC2-P3,IC5-P1 |
| net7 | IC2-P4,IC3-P1 |
| net8 | IC2-P5,IC3-P2 |
| net9 | IC3-P6,CN2-P1 |
| net10 | IC4-P5,IC5-P2 |
| net11 | IC5-P4,IC6-P1 |
| net12 | IC5-P5,IC6-P2 |
| net13 | IC6-P5,CN2-P3 |

FIG. 5 design rule

| item | mother board | substrate1 | substrate2 |
|---|---|---|---|
| smallest grid | 0.1 | 0.1 | 0.1 |
| foil width | 0.2 | 0.1 | 0.08 |
| foil space | 0.2 | 0.1 | 0.07 |
| component space | 1.0 | 0.2 | 0.2 |
| diameter of via hole | 0.3 | 0.2 | 0.2 |

FIG. 6 component configuration data

| component names | mother board | substrate1 | substrate2 |
|---|---|---|---|
| MN10 | DIPpackage / QFPpackage | bare chip | bare chip |
| MN20 | DIPpackage | bare chip | bare chip |
| MN30 | QFPpackage | bare chip | bare chip |
| AB80 | QFPpackage | no bare chips | no bare chips |
| CNCT3 | connector | no bare chips | no bare chips |
| (MCM) | MCMpackage1 / MCMpackage2 / MCMpackage3 | no bare chips | no bare chips |

FIG. 7 evaluation values

| component names | configurations | evaluation values(costs) |
|---|---|---|
| MN10 | DIPpackage<br>QFPpackage<br>bare chip(MCM) | 80<br>120<br>180 |
| MN20 | DIPpackage<br>bare chip(MCM) | 100<br>160 |
| MN30 | QFPpackage<br>bare chip(MCM) | 150<br>210 |
| AB80 | QFPpackage | 150 |
| CNCT3 | connector | 100 |
| (MCM) | MCMpackage1<br>MCMpackage2 | 200<br>300 |

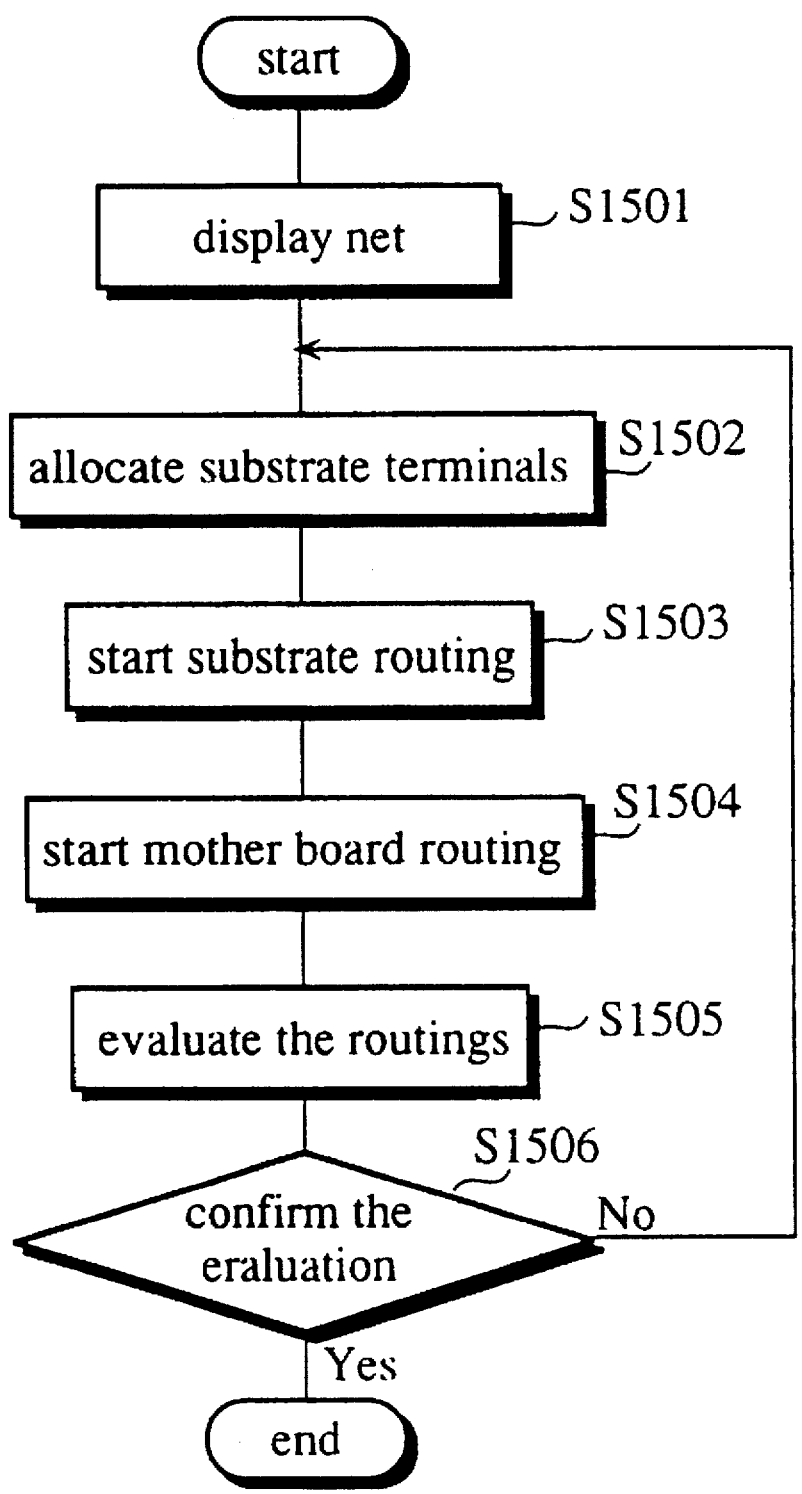

nets which include general component terminals display of the net which includes bare chip terminals display of the net which includes terminals net

| net names | terminals included in the net (component numbers — terminal numbers) | | |
|---|---|---|---|
| | bare chip terminal | terminal | general component terminal |
| A | BARE1-4 | | IC1-2 |
| B | BARE1-5 | CSP-13 | IC1-4 |
| C | BARE1-3 | CSP-9 | IC1-2,IC2-1 |
| D | | | IC1-8,IC2-8 |
| ... | | | |

3709
substrate routing net 3710
general component terminal 3710
general component terminal 3712
mother board routing

LAYOUT DESIGNING APPARATUS FOR CIRCUIT BOARDS

BACKGROUND OF THE INVENTION (1) Field of the Art

The present invention relates to an apparatus for designing placement of components and routing between terminals of components on circuit boards, using a computer.

(2) Description of the Prior Art

In recent years, as the components are densely laid out on a printed circuit board (mother board), layout designing using a multichip module (MCM) and a chip size package (CSP) are commonly used. The MCM and the CSP are densely laid out components on substrates, which will be laid out on the mother board. Components include bare chips.

The MCM has the same configuration as an LSI package in respect of a plurality of bare chips on the substrate and packaging the substrate. In a broad sense, the MCM can be regarded as a conventional hybrid IC.

The CSP is substantially the same with the MCM except for only one point. In the CSP, only one bare chip is laid out on the substrate.

Generally, layout designing for the circuit board means deciding, based on a circuit diagram (schematic) made by a circuit designing, which components should be laid out where on the circuit board and how the routing paths between components should be laid out.

In order to realize the efficient layout designing, CAD (computer aided design) system is used commonly now. CAD which supports the layout designing for the mother board, has already been developed.

The following examples are conventional layout designing.

"CAD/CAE system corresponding to high-function layout" page 13–36, featured in July 1993 issue of "Electronics layout skills", a publication by Jouhou-Chousa-Kai (Inc.)

Also, another art to increase layout efficiency of a chip on MCM can be found in U.S. Pat. No. 5,295, 082, "EFFICIENT METHOD FOR MULTICHIP MODULE INTERCONNECT".

However, both prior arts does not guarantee layout designing for the mother board and the substrate at the same time.

The following passages are descriptions of the prior art. In a conventional layout, a designer, in view of costs and sizes, decides which components as a group should be laid out on the substrate, and starts laying out the components. The substrate on which components are laid out is treated as if it is one component, and used in layout designing for the mother board next.

FIG. 1 describes the flow of a conventional designing.

(Step 101) This step examines whether to use an MCM or not, classifies components, decides which components should be laid out on the substrate. Normally, if a plurality of components (bare chips) are laid out on one substrate, miniaturization and improvement of electricity characteristics can be realized, but the production cost goes up. The examination requires various factors to be taken into consideration. Usually, the designer uses his/her own experience without using CAD.

(Step 110) Based on the examination, the layout designing for all the necessary substrates is carried out. The procedure of designing for each substrate is almost the same as the procedure for the conventional mother board.

(Step 111) First, as a preliminary stage, data such as component list obtained in circuit diagram CAD and the like and connecting information between terminals are inputted.

(Step 112) Design rules for the substrate are set.

(Step 113) Component configuration on the substrate is also set.

(Step 114) In placement, it is decided where the components should be placed on the substrate.

(Step 115) In routing, interconnection between terminals is carried out observing the design rules.

(Step 116) Lastly, design data such as placement coordinates and angles of components and coordinates of routing paths are outputted.

(Step 117) When all the designing for the substrate is completed by the above mentioned steps, designing for the mother board is started.

In designing for the mother board, the substrate on which components are laid out can be treated equally with other general components. So, laying out the substrate for the mother board is the same as laying out other general components for the mother board.

(Steps 121–126) Therefore, as the first procedure for the mother board, after the list of the general components, including the substrate, which is to be laid out on the mother board and the connecting information data between the terminals are inputted, the rest of the procedures are basically the same as the procedures for the substrate. So the explanation is not given here.

(Step 131) After a series of the layout designing for the mother board is completed, a size, height, and cost of the circuit board, are evaluated. If the evaluation results are not satisfactory and that is regarded as being attributable to the classification of components, it is necessary to start the layout design all over again from Step 101. Also, though it is not illustrated in the flow chart, sometimes it is necessary to go back to Step 101 after a similar temporary evaluation in placing components on the mother board.

The layout designing for the conventional circuit board is carried out in the above mentioned way. The method is by no means efficient for the circuit board which entails the substrate. The reason is, when all the necessary layout designing for the substrate is completed, the layout designing for the mother board is started. So, evaluation for the completed layout designing for the substrate cannot be obtained unless the layout designing for the mother board proceeds to some degrees. Therefore, it is not until the time of layout designing for the mother board that the nonconformities resulted from the completed layout designing for the substrate are found. In such a case, the layout designing for the substrate has to be started all over again. And when the designing for the substrate is completed, layout designing for the mother board has to be started all over again based on the design result of the new substrate.

For example, when components are laid out on the mother board, sometimes it becomes clear for the first time that more components should have been laid out on the substrate so that all the necessary components can be laid out on the limited space of the mother board. In such a case, a component group which is to be laid out on the substrate should be re-evaluated and new component group has to be made. But, if too many components are used for an MCM in order to avoid such a redoing, the production cost goes up.

Also, when the routing paths are laid out on the mother board, sometimes it becomes clear for the first time that the positions of the substrate, the allocation of the terminals and the like are inappropriate. Redoing is required.

SUMMARY OF THE INVENTION

It is an object of this invention to provide an efficient layout designing apparatus for circuit boards which can carry out the layout designing for the mother board and for the substrate at the same time.

The above object may be fulfilled by the layout designing apparatus for circuit boards which shows the following twelve features.

(1) The layout designing apparatus for circuit boards including a mother board and a substrate comprises a layout data storage unit for having areas to store data; an operation unit for giving directions; a mother board setting unit for creating the data about the mother board in the layout data storage unit according to the operation unit; a substrate placement unit for creating the data in the layout data storage unit according to the operation unit so that the substrate of a given configuration is placed on a given place on the mother board; a component placement unit for creating the data in the layout data storage unit according to the operation unit so that components of given configurations are placed on given places on the mother board and on the substrate; a routing unit for creating the data in the layout data storage unit according to the operation unit so that routing paths of given configurations are laid out on the mother board and on the substrate; a display unit; and a layout data display control unit for controlling the display unit to display configurations and places of the mother board, the substrate, components and routing paths as created.

(2) The component placement unit may include a component configuration data storage unit for storing configurations and sizes of each component placed on the mother board and placed on the substrate; a circuit board judgement unit for judging whether each component is placed one of on the mother board and on the substrate by the operation unit; and a placement processing unit for reading from the component configuration data storage unit the component configuration and size based on the judgement of the circuit board judgement unit and editing the data in the layout data storage means so that the component having the configuration and the size is placed on the circuit board designated by the operation means.

(3) The routing unit may include a mother board routing unit for creating the data in the layout data storage unit according to the operation unit so that the routing path interconnecting a component terminal on the mother board and a given substrate terminal may be laid out on the mother board; and a substrate routing unit for creating the data in the layout data storage unit according to the operation unit so that the routing path interconnecting the given substrate terminal and the given component terminal on the substrate may be laid out on the substrate.

According to the construction (1), (2), and (3), the display means displays the places of each circuit board, components and routing paths, so that the designer can carry out layout designing by looking at the display, without distinguishing the mother board and the substrate. Therefore, layout designing for the mother board and for the substrate can be carried out at the same time and re-doing can be avoided.

(4) A total evaluation value calculation unit may calculate individual total evaluation value for each circuit board by totaling the evaluation value for components placed on each circuit board.

In this construction (4), the component placement of each substrate is evaluated. Therefore, the best layout design can be realized in a short time by a more accurate and precise evaluation.

(5) The routing unit may include a routing judgement unit for judging whether the substrate terminal designated by the operation means is already used for the routing; and a routing path deletion unit for editing the data in the layout data storage means, in case only the terminal has already been used for routing, so that the routing path for the terminal is deleted.

In this construction (5), changing all the necessary routing paths is carried out automatically. Therefore, the time needed for routing can be reduced.

(6) The layout designing apparatus may further comprise an equal substrate storage unit; an equal substrate designation operation unit for designating, from a plurality of substrates placed on the mother board, desired substrates with an equal attribute; an equal substrate setting unit for storing information in the equal substrate storage unit, the information identifying the substrates designated by the equal substrate designation operation unit; an equal substrate judgement unit for judging whether the substrate used for placement or routing according to the operation unit is one of the equal substrates based on the information in the equal substrate storage unit; an equal component placement unit for editing the data in the layout data storage unit so that when the equal substrate judgement means judges that one of a plurality of equal substrates has components placed upon it, the counterpart components are placed on the same place as the rest of the equal substrates; and an equal routing path layout unit for editing the data in the layout data storage unit so that when the equal substrate judgement means judges that one of a plurality of equal substrates has a routing path laid out upon it, the counterpart routing path is laid out on the same area of the rest of the substrates.

According to this construction (6), by designating a plurality of substrates having the equal attribute, just carrying out layout designing for one of the substrates is enough because the rest of the substrates are treated in the same way. Therefore time needed for layout designing for the substrate is reduced.

(7) The layout designing apparatus may further comprise a net storage unit for storing a plurality of the nets, each of the nets having two component terminals which is to be used for interconnection; and a net display control unit for controlling the display unit to display a line interconnecting component terminals on the display unit.

(8) The routing unit may include a net choice operation unit for choosing one net from the net storage unit, one net being used for the interconnection between the component terminal on the mother board and the component terminal on the substrate; a substrate terminal storage unit for storing information which identifies the substrate terminals which are to be used for routing; a substrate terminal setting unit for setting information in the substrate storage unit, the information identifying all the substrate terminals for the net chosen by the net choice operation unit based on the data in the layout data storage unit; a substrate routing judgement unit for choosing one substrate terminal from the substrate terminal storage unit and judging whether it is possible to lay out the routing path which interconnects the substrate terminal and the component terminal on the substrate for the nets chosen by the net choice operation unit; a mother board routing judgement unit for judging whether it is possible to lay out on the mother board the routing path between the substrate terminal chosen by the substrate routing judgement unit and the component terminal on the mother board; a routing repeat control unit for deleting, when at least one of the substrate routing judgement unit and the mother board routing judgement unit judges "impossible", the certain substrate terminal in the substrate terminal storage unit and operating so that the processings in the substrate routing judgement unit and the mother board routing judgement unit are repeated, the certain substrate terminal being used for the judgement "impossible"; and a routing processing unit for editing the data in the layout data storage unit, when the substrate routing judgement unit and the mother board routing judgement unit judge "possible", so that the routing paths are laid out on the mother board and on the substrate according to the judgement above.

In the construction (7) and (8), the nets are displayed as straight lines interconnecting component terminals on the mother board and component terminals on the substrate. In this interconnection, substrate terminals which are to be used for the routing are decided automatically and routing for the substrate and for the mother board are carried out automatically. Therefore, time needed for the routing for the mother board and for the substrate is reduced.

(9) The layout designing apparatus may further comprise an evaluation value storage unit for storing evaluation values of each component, the evaluation values which correspond to kinds, configurations, and sizes of the components and the combination of them; an upper bound evaluation value acquirement unit for acquiring an upper bound evaluation value which can be a standard for classifying components; a component classification unit for classifying all the components yet to be placed designated by the operation unit into components which are to be placed on the substrate and components which are to be placed on the mother board; a total evaluation value calculation unit for calculating the total evaluation value by reading and totaling, for each classified component, the evaluation value stored in the evaluation value storage unit; an evaluation value judgement unit for judging whether the total evaluation value is equal to the upper bound evaluation value or below; a component re-classification unit for re-classifying, based on the evaluation values in the evaluation value storage unit, the components yet to be placed so that the total evaluation value becomes closer to the upper bound evaluation value, when the evaluation value judgement unit judges the total evaluation value is not equal to the upper bound evaluation value or below; and a classification information display control unit for operating so that the information about classification by the component classification unit and component re-classification unit is displayed on the display unit.

In this construction (9), all the components are automatically classified into the components to be placed on the substrate and the components to be placed on the mother board. Therefore, there's no need to find out components which satisfies a given standard value. So operations in the early stages of the layout designing can be reduced.

(10) The layout designing apparatus may further comprise a component configuration data storage unit for storing each of the component configurations on the mother board and on the substrate; a component acquirement unit for acquiring all the components which are to be placed on one substrate; and a substrate configuration decision unit for calculating a total occupied size based on a given rule according to the configurations of all the components acquired by the component acquirement unit, deciding based on a given rule the size of the substrate which is bigger than and closest to the total occupied size, and editing the data in the layout data storage unit to place the decided substrate on the mother board.

According to this construction (10), if the designer designates components which are to be placed on one substrate, the most suitable substrate configuration for the placement is automatically decided. Therefore, just adopting the decided substrate configuration will reduce operations in the early stages of the layout designing.

(11) The layout designing apparatus may further comprise a mother board automatic component placement unit for editing the data in the layout data storage unit so that the substrate, on which components should be placed is decided, is regarded as one component and is placed on the mother board according to a given role.

(12) The layout designing apparatus may further comprise a substrate automatic component placement unit for editing the data in the layout data storage unit, in view of the connection to the already placed other components on the circuit boards, so that the components designated by the operation unit are placed on the substrate according to a given rule.

According to the construction (11) and (12), a plurality of components including the substrate are placed on the mother board automatically. And the components are placed automatically on the most suitable places on the substrate in view of the interconnection between the substrate components and the mother board components. Therefore, operations needed for layout designing for the mother board and for the substrate can be reduced.

BRIEF DESCRIPTION OF THE DRAWINGS

The object, advantages and features of the invention will become apparent from the following description thereof taken in conjunction with the accompanying drawings which illustrate a specific construction of the invention. In the drawings:

FIG. 3 is an example of a list of components which constitutes layout data stored in a design data storage unit 230A.

FIG. 4 is an example of a table which shows nets which show interconnections between component terminals and constitute the layout data stored in the design data storage unit 230A.

FIG. 5 is an example of table which shows design rules stored in a design rule storage unit 230B.

FIG. 6 is an example of a table which shows component configuration data stored in a component configuration data storage unit 230C.

FIG. 7 is an example of table which shows the evaluation values stored in an evaluation value storage unit 230D.

FIG. 15 is a flow chart which shows detailed operations of routing of the present invention.

DESCRIPTION OF THE PREFERRED EMBODIMENTS

In the following embodiments, the layout designing apparatus for circuit boards will be described by means of diagrams.

(Embodiment 1)

Embodiment 1 shows an example of laying out various components and routing paths on the circuit boards using the layout designing apparatus for circuit boards according to an example of the present invention.

Basically, "place components","layout components" and "lay out routing paths" mean layout designing using the present apparatus. It does not mean actual operations are happening.

<Construction>

Figure 1:
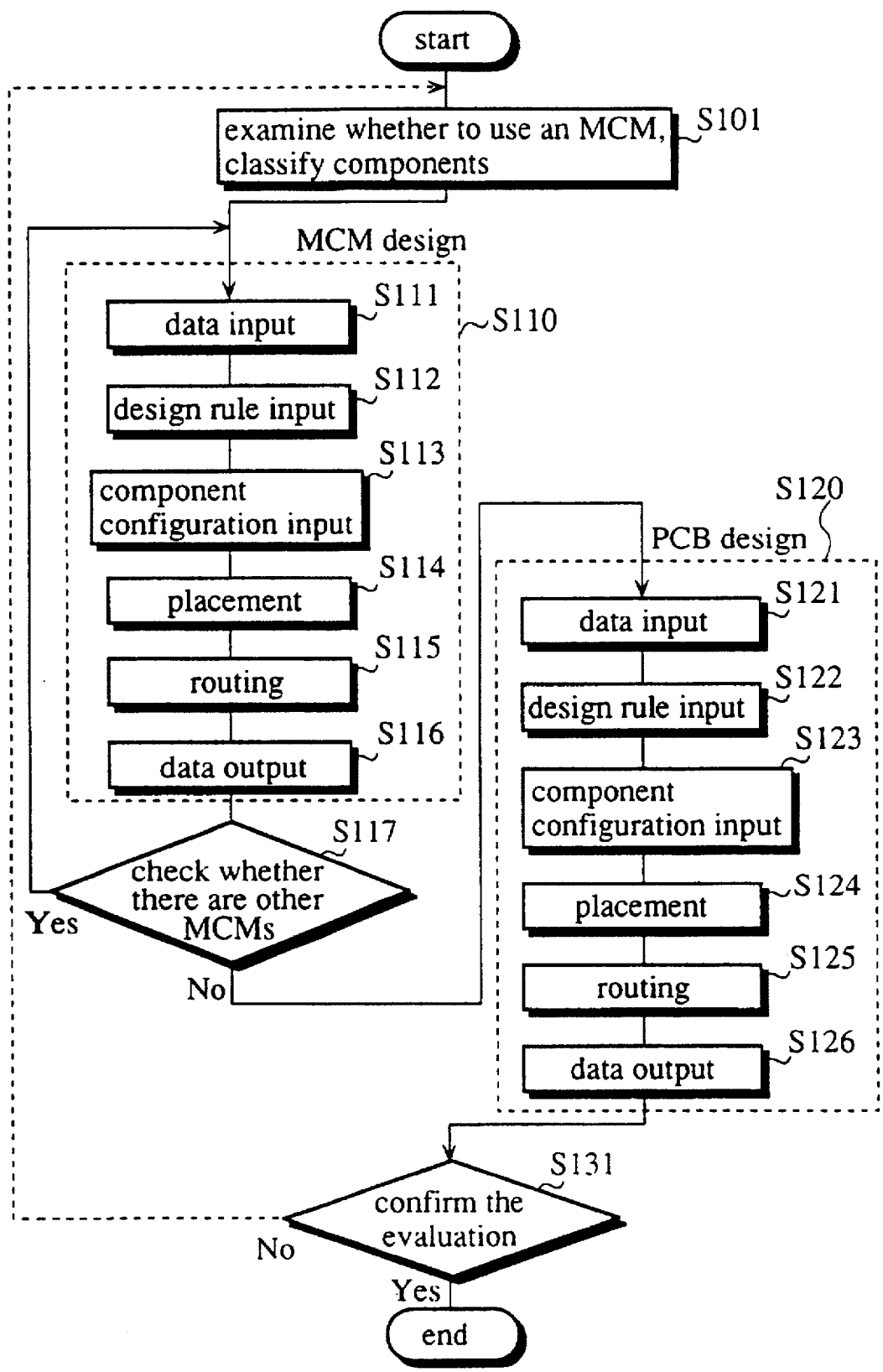
FIG. 1 is a flow chart of a processing procedure of a conventional layout designing.
Figure 2:
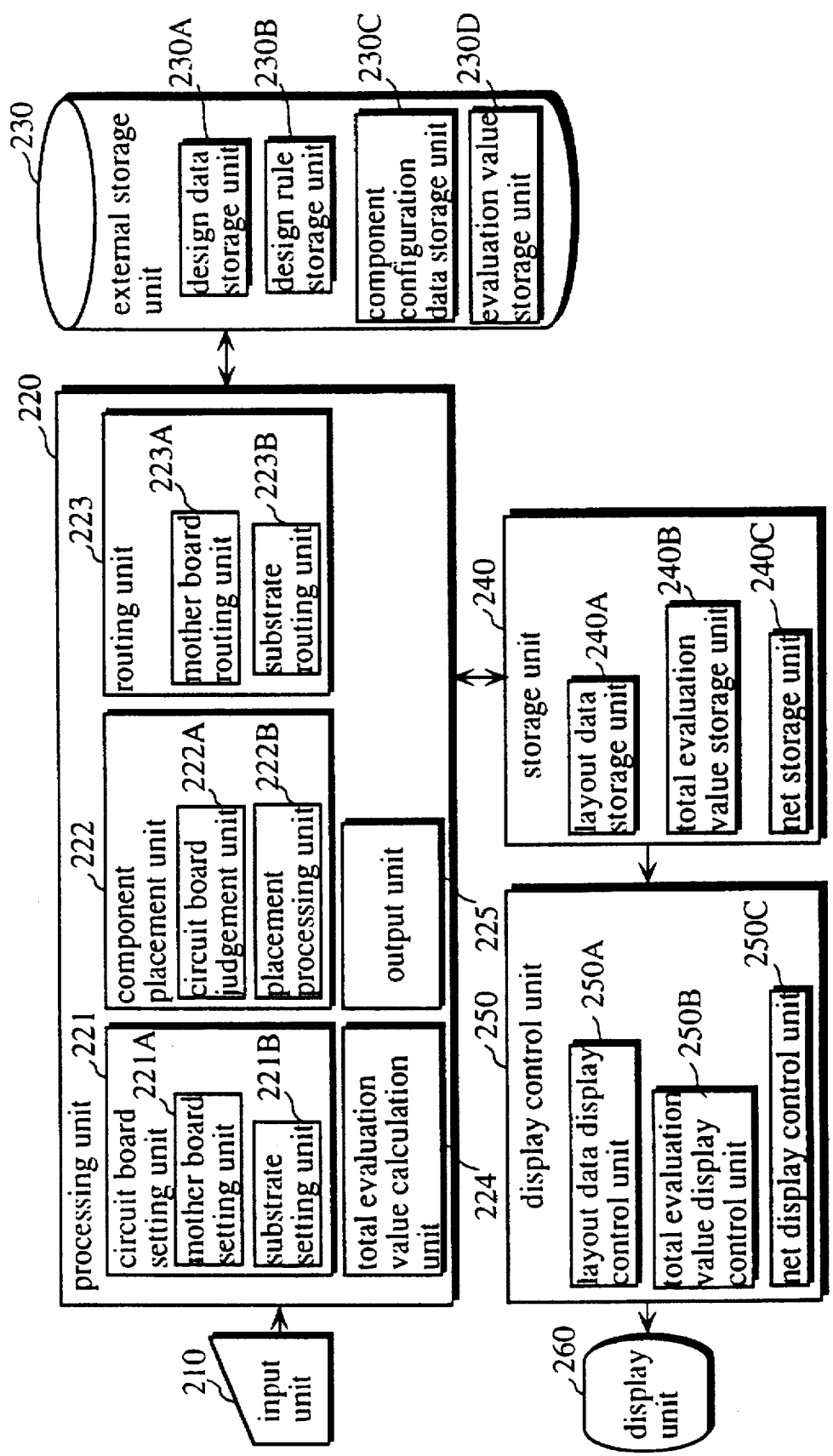
FIG. 2 is a block diagram which shows construction of Embodiment 1 of the present invention.

FIG. 2 shows a block diagram of the construction of the layout designing apparatus for circuit boards according to Embodiment 1.

The present apparatus comprises a processing unit 220, an input unit 210, an external storage unit 230, an storage unit 240, a display control unit 250, and a display unit 260.

<Input unit 210>

An input unit 210 comprises a key board, a mouse and the like. The designer can carry out layout designing interactively by operating the input unit 210.

<Display unit 260>

A display unit 260 comprises CRT and the like.

<External storage unit 230>

An external storage unit 230 is made out of magnetic discs and the like. It further includes a design data storage unit 230A, a design rule storage unit 230B, a component configuration data storage unit 230C and an evaluation value storage unit 230D. For the information, design data generated by the CAD system and the like or the data edited by input unit 210 are used.

The design data storage unit 230A stores design data which are used for layout designing, specifically, a component list and nets which show how the components are interconnected. As illustrated in FIG. 3, the component list is made up of the component numbers and names. The component numbers are given in order to identify, in a circuit, the components which are inputted by a circuit designer. Component names are like TTL IC "7415", "7416". Components having the same name have the same function. But when they are placed on the circuit board, sometimes package configurations (e.g. DIP, QFP and the like) are different.

As shown in FIG. 4, the net is made up of data, a combination of net names for identification and terminal names of each component which is to be interconnected. For example, net 1 shows an interconnection between terminal P1 of component CN1 and terminal P1 of component IC1. Net 6 shows an interconnection between terminal P6 of component IC1, terminal P3 of component IC2, terminal P1 of component IC5.

The design rule storage unit 230B stores design rules for each circuit board. Design rules are necessary for producing circuit boards. Contents of the design rules are proper space (clearance) between components, width of routing, and diameters of via holes for connecting both sides on circuit boards and between layers. The design rules have a lot to do with a production method of circuit boards, so there are different design rules for different circuit boards. FIG. 5 shows an example of inputted design rules.

The components configuration data storage unit 230C stores data about component configurations. Component configurations are configurations of the component packages which is actually placed on the circuit boards. Normally, one component is covered by one package. Sometimes, components with the same function are covered by different packages. If a plurality of kind of packages are available, the designer decides which package to use in view of sizes, prices and production methods. In the MCM, a plurality of bare chips are covered by one package, so the component configuration on the substrate is the bare chip. The substrate configuration is also inputted for the substrate is treated as one package on the mother board.

FIG. 6 shows an example of inputted component configuration data. In the component configuration data storage unit 230C, configurations are stored as data of line and circles using coordinates of relative length, width, and height from the component origin.

For example, package of DIP and QFP can be used for MN10. MN10 can use the MCM using bare chips. For AB80, only QFP package can be used. AB80 cannot use the MCM because bare chips are not available. In the place named MCM, prospective packages for laying out the substrate on the mother board are stored. A designer can input and edit the component configuration data in the middle of layout designing if necessary.

The evaluation value storage unit 230D stores evaluation values which is a standard for judging the appropriateness of the completed layout design. In FIG. 7, evaluation values are treated as component cost data. Component prices depend on the package, so component costs corresponding to the configurations are stored. Especially, if a component can use the MCM, the cost of bare chips are stored. Also, the cost including the substrate of MCM are stored. As component cost, not only the cost needed for the production but also other factors such as values of reliability and deadline can be stored as component cost.

<Storage unit 240>

The storage unit 240 temporarily stores information composed of ROM and RAM, further includes a layout data storage unit 240A, total evaluation value storage unit 240B and the net storage unit 240C.

The layout data storage unit 240A have areas to store data which are constructed according to the layout designing by the present apparatus, specifically, data about places, configurations, and sizes of components, and routing paths to be laid out on each circuit board.

The total evaluation storage unit 240B stores total evaluation values which are calculated, based on a given rule, the total of the evaluation values of each component stored in the evaluation storage unit 230D.

The net storage unit 240C stores temporary nets for editing nets stored in the layout data storage unit 240A and displaying them on the display unit 260.

"Edit" data stored in the storage unit 240 means to renew, change, and delete the data.

<Processing unit 220>

The processing unit 220 is composed of CPU and the like, and further includes a circuit board setting unit 221, a component placement unit 222, a placement unit 223, a total evaluation value calculation unit 224, and an output unit 225.

The circuit board setting unit 221 further includes a mother board setting unit 221A and a substrate placement unit 221B.

The mother board setting unit 221A creates the data about the mother board in the layout data storage unit 240A.

According to the input unit 210, the substrate placement unit 221B creates the data in the layout data storage unit 240A so that the substrate of a given configuration is placed on a given place on the mother board.

According to the input unit 210, the component placement unit 222 creates the data in the layout data storage unit 240A so that components of given configurations are placed on given places on the mother board and on the substrate.

The component placement unit 222 further comprises a circuit board judgement unit 222A and a placement processing unit 222B. Details of functions of these units are described later.

According to the input unit 210, the routing unit 223 creates the data in the layout data storage unit 240A so that routing paths of given configurations are laid out on the mother board and on the substrate. The routing unit 223 further includes a mother board routing unit 223A and a substrate routing unit 223B. Details of functions of these units are described later.

The output unit 225 stores layout data and the like of the storage unit 240, which are edited by each processing in the processing unit 220, in the external storage unit 230. The output unit 225 also outputs the layout data and the like to a CAM unit and a simulator.

The processing unit 220 also deals with inputting and outputting data among the input unit 210, the external storage unit 230, and the storage unit 240.

<Display control unit 250>

The display control unit 250 transfers data which are temporarily stored in the storage unit 240 to the display unit 260 and controls the data so that each content is displayed in the form of diagrams and the like. The display control unit 250 further includes a layout data display control unit 250A, a total evaluation display control unit 250B and a net display control unit 250C. Details of those units are described later.

<Operations>

Operations of each unit making up the present apparatus follow next.

Figure 8:
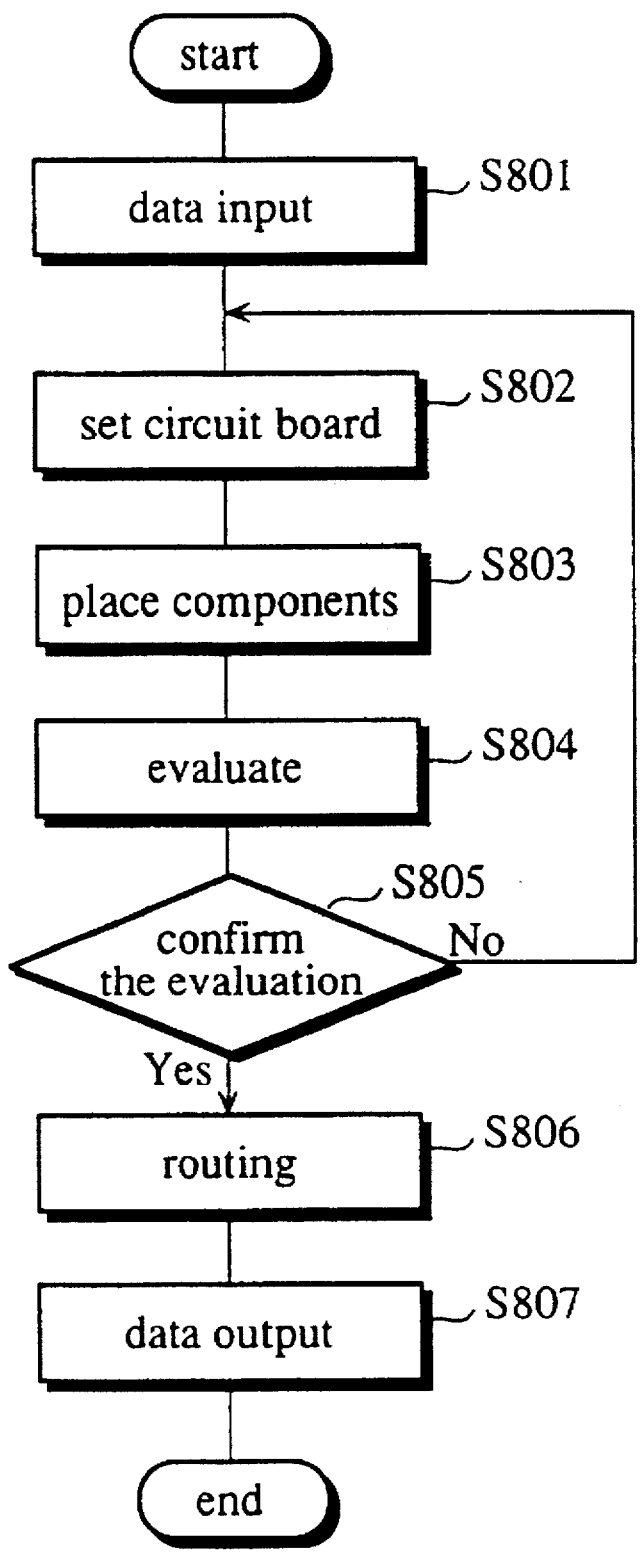
FIG. 8 is a flow chart of operations in Embodiment 1 of the present invention.

FIG. 8 describes a flow of the layout designing using the present apparatus.

(Step 801) Data which is necessary for layout designing are prepared in the external storage unit 230.

(Step 802) A designer sets the mother board and a plurality of substrates which are to be laid out on the mother board.

(Step 803) The designer places necessary components on the substrate and on the mother board.

(Steps 804–805) When a series of placing components is completed, it is confirmed whether the placements have been appropriate or not.

(Steps 802–804) The above mentioned placing is repeated if necessary.

(Step 806) When placing components is completed, the designer lays out routing paths on the substrate and on the mother board.

(Step 807) When laying out routing paths is completed, layout data which are already made are outputted.

Figure 9:
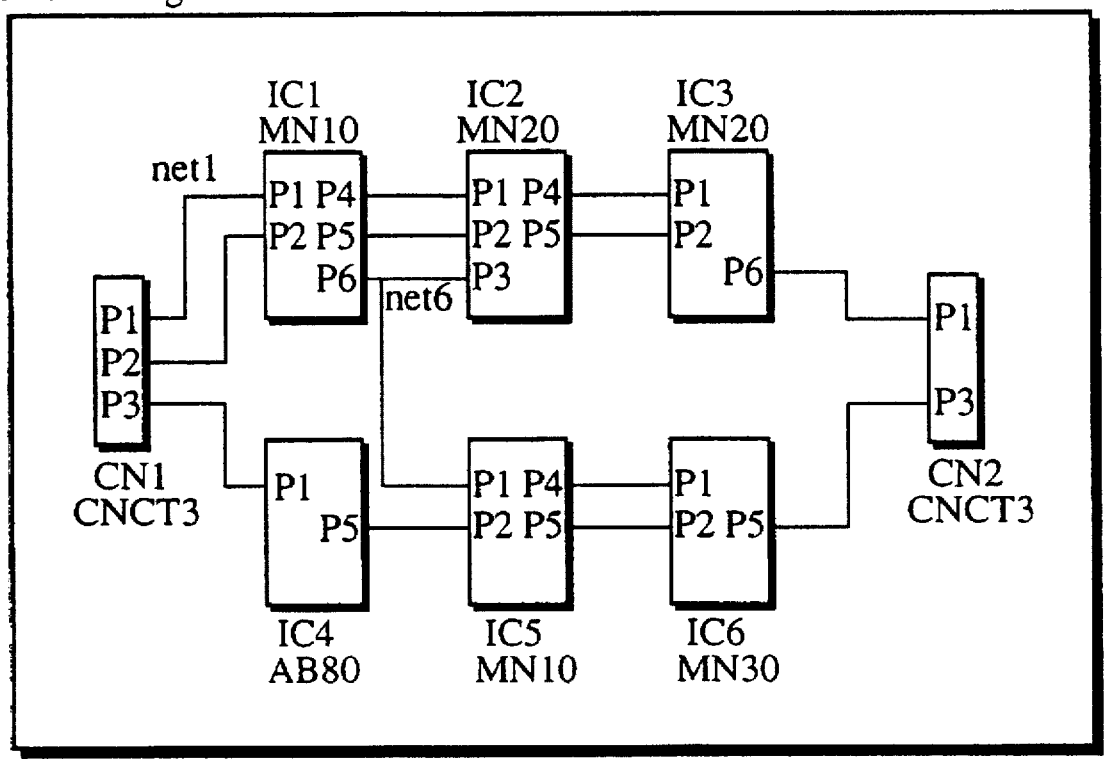
FIG. 9 is an example of a circuit diagram to be used for layout designing.

FIG. 9 shows a circuit diagram in which several substrates are laid out on the mother board. In FIG. 9, a rectangle shows a component. For each rectangle, two lines of letters and numbers are given. The upper lines such as IC1, IC2 show component numbers and the lower lines such as MN10 and MN20 show component names.

<Data input>

(Step 801) The designer prepares data which is needed for the layout designing and stores them in the external storage unit 230. Design data, design rules, component configuration data and evaluation values are necessary.

Normally, data outputted from a circuit design CAD and the like are used for design data. FIGS. 3 and 4 show examples of a component list and nets which can make up the design data, each data shows contents of the circuit diagram in FIG. 9.

FIGS. 5, 6, and 7 show examples of the prepared design rules, the component configuration data and the evaluation values.

<Circuit board setting>

Figure 10:
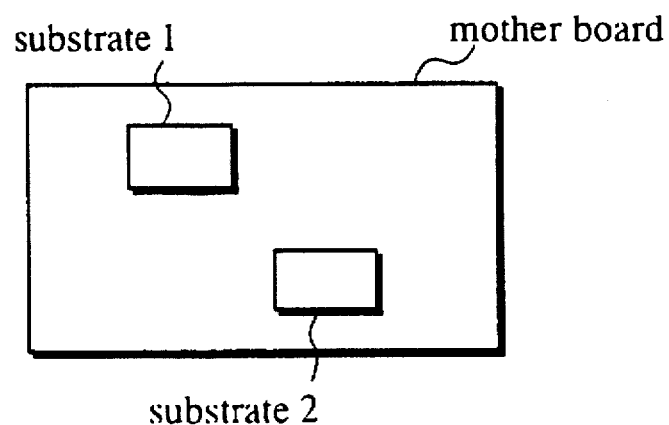
FIG. 10 is a display example of the layout data right after a mother board and a substrate are set.

(Step 802) Using the input unit 210, the designer inputs places, configurations, and sizes of one mother board and a plurality of substrates which are to be placed on the mother board. At this stage, temporary data of the substrate configurations can be used for the input, as the final configurations can be decided later. FIG. 10 shows the configurations and places of the inputted mother board, substrates 1 and 2. By the mother board setting unit 221A and the substrate placement unit 221B, the inputted coordinate information is stored in the layout design data storage unit 240A as layout data. The data in the layout data storage unit 240A is always transferred to the display unit 260 by the layout data display control unit 250A and displayed in the form of a diagram shown in FIG. 10.

<Component placement>

Figure 11:
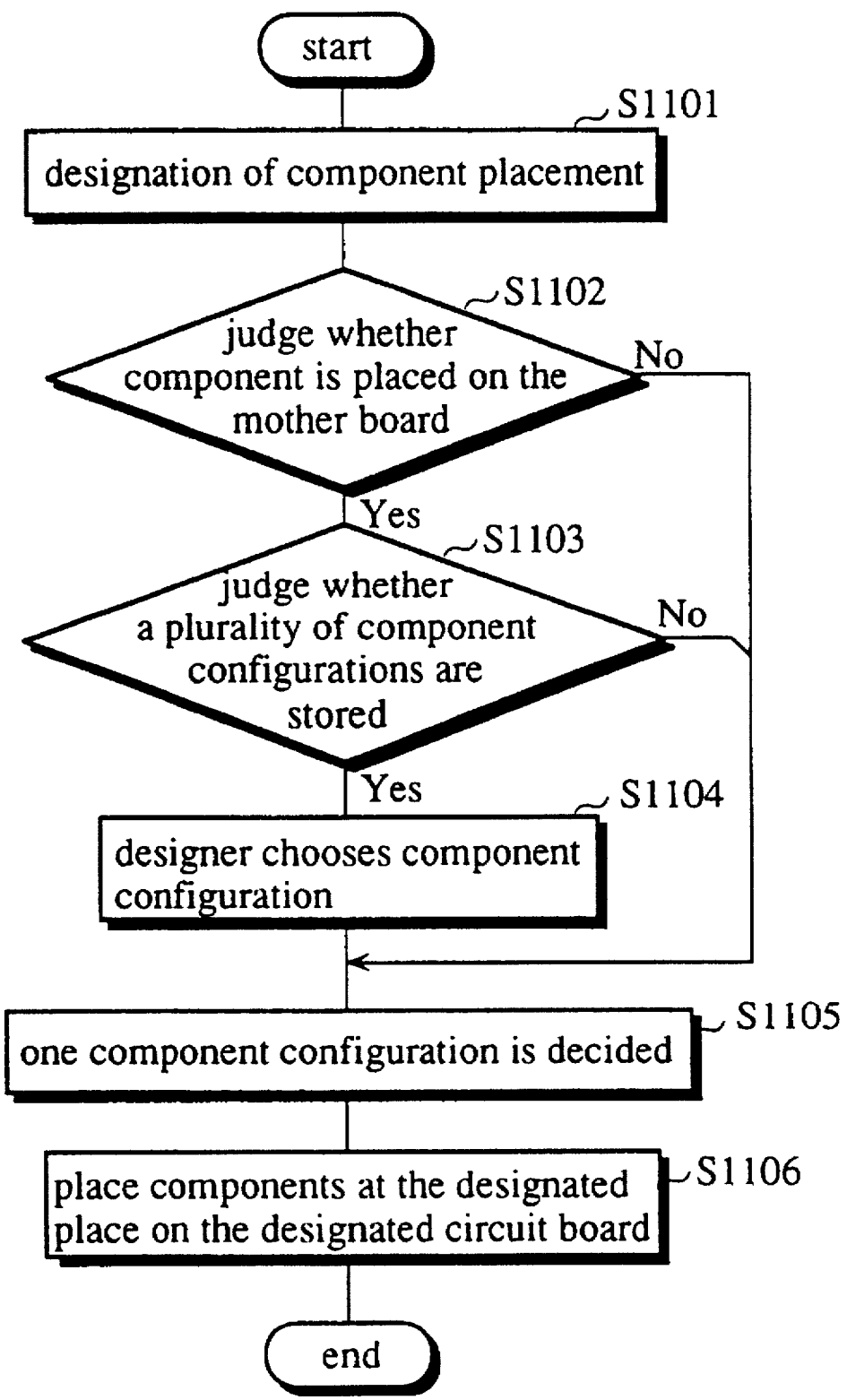
FIG. 11 is a flow chart which shows detailed operations of component placement of the present invention.

(Step 803) The designer places components. The operations are shown in FIG. 11.

(Step 1101) Using the input unit 210, the designer designates components which are to be laid out, circuit boards, and places on the circuit boards. At this point, the designer starts placing components, choosing the components which have the strongest connection relations with the already placed components by referring to the prepared design rules and nets. Not only components which are yet to be placed but also components which are already placed can be used. Components which are already placed can be moved to other places on the same circuit board or onto the other circuit board.

(Step 1102) Once the designation to place components is given, the circuit board judgement unit 222A judges whether each component is placed on the mother board or on the substrate.

(Steps 1102–1105) From the component configuration data storage unit 230C, the placement processing unit 222B reads the component configuration and size based on the judgement of the circuit board judgement unit 222A.

(Step 1103) If component configurations are stored for the directed component, (Step 1104) the designer chooses one component configuration out of them, (Step 1105) and one component configuration is decided.

(Step 1106) The placement processing unit 222B edits the data in the layout data storage unit 240A so that the component having the configuration and the size is placed on the circuit board designated by the input unit 210. The edited layout data is transferred to the display unit 260 by the layout data display control unit 250A and each circuit board and the components are displayed keeping their configurations, sizes, and places.

Figure 12:
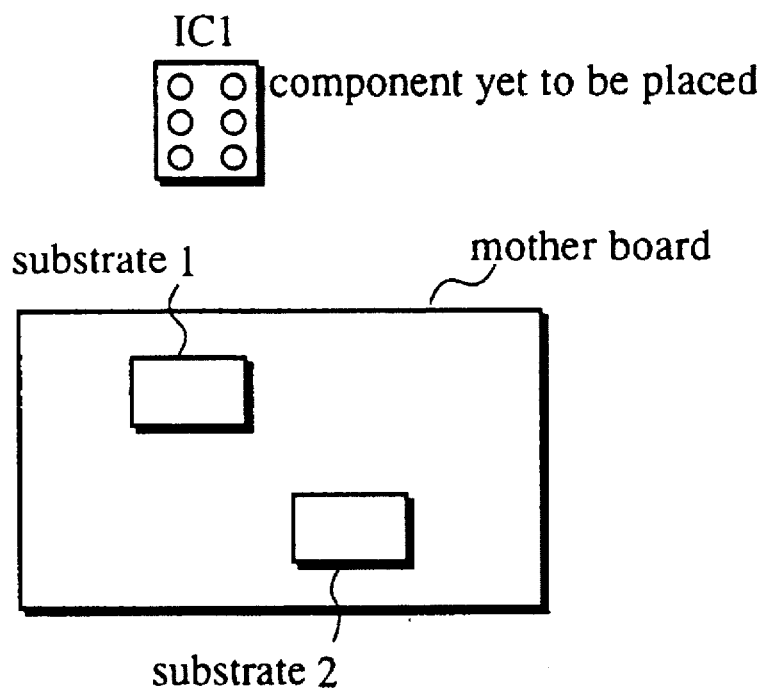
FIG. 12 is a display example of the layout data in time of placing one component yet to be placed on a circuit board.
Figure 13:
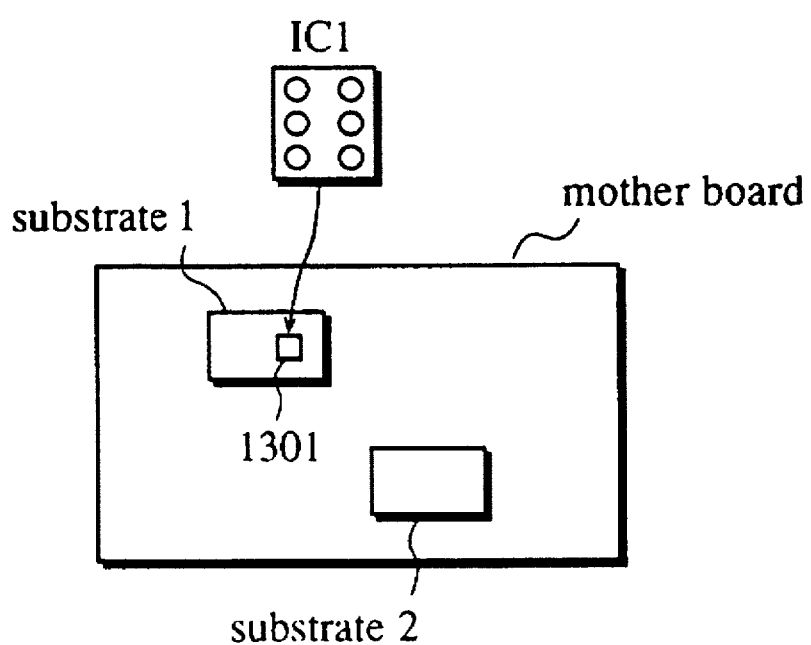
FIG. 13 is a display example of the layout data right after one component yet to be placed is placed on the circuit board.
Figure 14A:
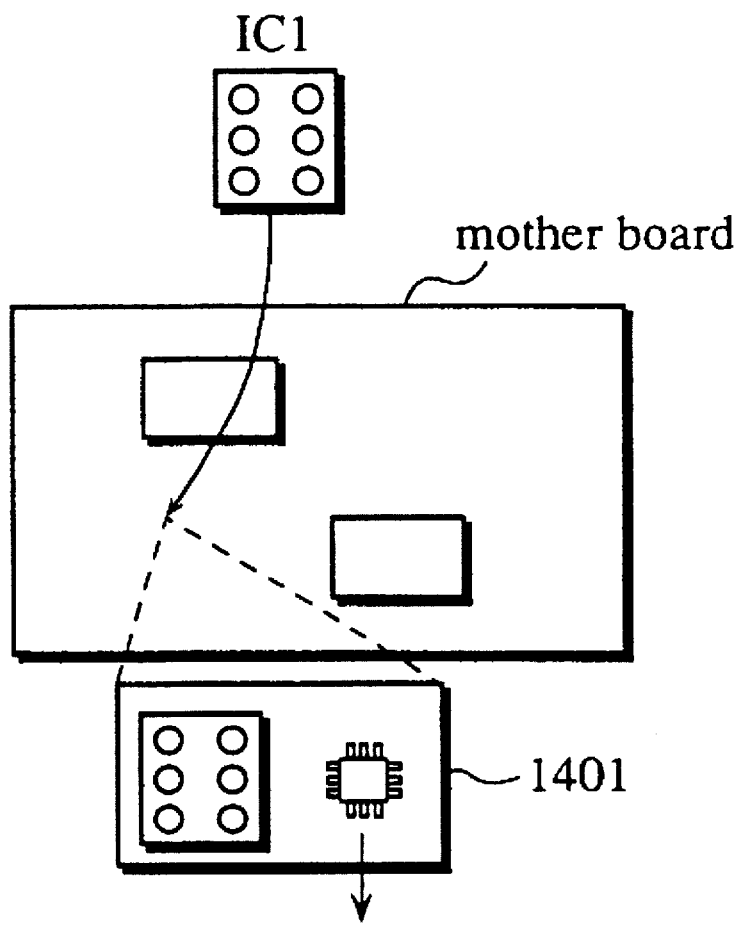
FIG. 14A is a display example of the layout data in case one component yet to be placed is designated to be placed on the mother board.
Figure 14B:
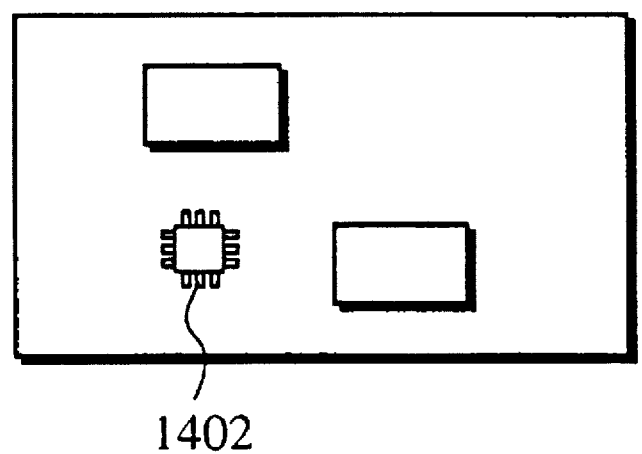
FIG. 14B is a display example of the layout data right after one component configuration is chosen from a plurality of component configurations.

The following explanation is about the case of placing component IC1 yet to be placed (MC10) illustrated in FIG. 12. As shown in FIG. 6, two component configurations in case of placing on the mother board and one bare chip in case of placing on the substrates are registered. Therefore as shown in FIG. 13, bare chip configuration 1301 is chosen among the component configuration data when it is designated that the placement place of the component IC1 yet to be placed should be on the substrate 1. On the other hand, as shown in FIG. 14, when the placement place of IC1 is on the mother board, two component configurations 1401 and 1402 (DIP package and QFP package) out of the component configuration data are presented to the designer by the display unit 260. The designer chooses either DIP package or QFP package. In the illustration, QFP is designated, so IC1 of QFP package 1402 is placed on the mother board.

This example is in case of placing components yet to be placed on the circuit board. But in case of moving the already placed components onto another circuit board, the component configurations are changed for the new circuit board. If a plurality of component configurations are registered for one circuit board, component configurations can be chosen even if the move happens on the same circuit board. Furthermore, only component configurations can be changed without changing the places on which components are already placed.

Also the final package configuration of the substrate, in case of laying out the substrate on the mother board, is also decided. Specifically the best configuration is chosen out of the configuration data of the MCM package registered in the component configuration data.

In addition, after automatic temporary placements by the well-known method like force placement method, the placement can be changed manually.

As explained, the present apparatus enables the designer to place components on the most desired circuit board and change them. So placing components on the mother board and on the substrate can be carried out at the same time. Unlike conventional designing apparatus, places, configurations and sizes of the circuit board are displayed as the designer designates regardless of the kinds of circuit boards, so that the designer can carry out designing with the accurate information about the places of components.

<Placement evaluation>

(Steps 804–805) After proper layout of components is completed, the designer can judge whether the placement has been appropriate or not. By reading and calculating evaluation values in the evaluation value storage unit 230D for already placed components, the total evaluation calculating unit 224 calculates total evaluation values for each circuit board and stores them in the total evaluation value storage unit 240B. By the total evaluation values display control unit 250B, the stored total evaluation values are displayed on one side of the mother board in the display unit 260.

In the display unit 260, component costs are totaled and displayed by referring to the component cost list shown in FIG. 7. Then the designer can judge whether the component placement has been appropriate or not. If the totaled cost is equal to allowable cost or below, the placement has been appropriate. But if the totaled cost is expensive, re-examination of MCM or component configuration choice is needed. Sometimes, sizes of the substrates and the places which are to be placed components are changed. According to the present apparatus, only the parts which need to be changed are changed. For evaluation values, mother board areas, a total of the space areas of the mother board, a height of the whole circuit board with components placed, and the like are used besides the above mentioned cost.

As explained above, the designer can place components evaluating the appropriateness of the placement in detail, so that redoing can be avoided.

<Routing>

(Step 806) After all the components are placed, routing is started. "Routing" means laying out routing paths on the circuit board. FIG. 15 shows the flow of laying out routing paths.

<Net display>

(Step 1501) Before routing, the designer displays the nets stored in the design data storage unit 230A on the display unit 260. The nets to be displayed are taken out of the design data storage unit 230A by the processing unit 220 and stored in the net storage unit 240C temporarily. The nets are displayed on the circuit boards which are displayed on the display unit 260 by the net display control unit 250C.

Figure 16:
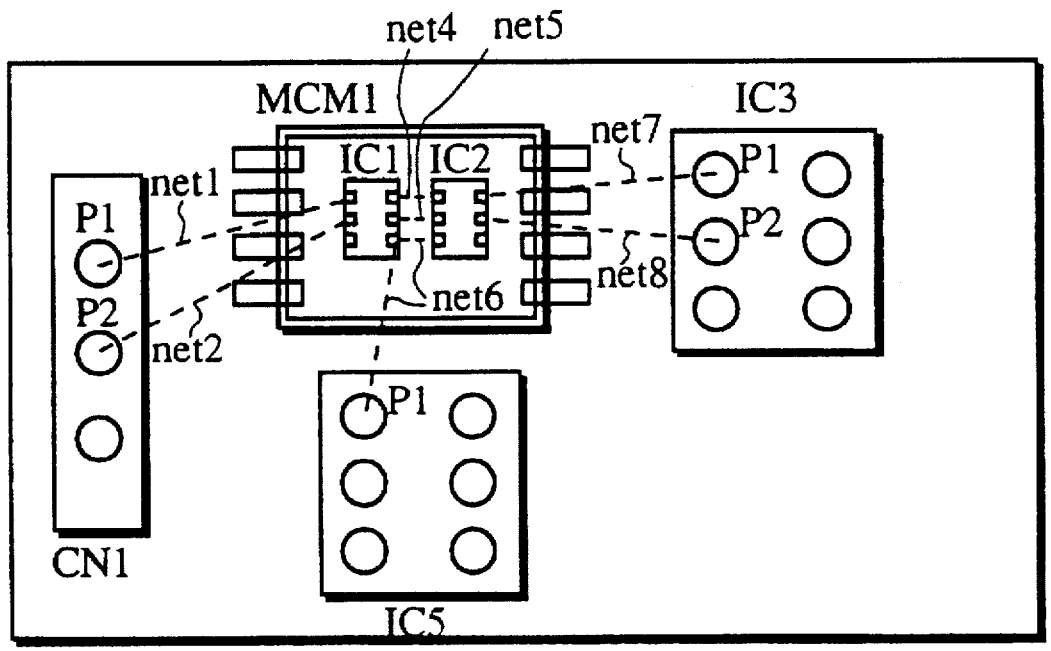
FIG. 16 is a display example of nets which are not via the substrate components.

FIG. 16 shows an example of nets which interconnect components placed on the mother board and components on the circuit board. The dotted lines show nets. For example, net 1 shows interconnecting terminal P1 of component CN1 and terminal P1 of component IC1. Likewise, net 2,4,5,7, and 8 show interconnection between two terminals. Net 6 shows interconnection between terminal P6 of component IC1, terminal P3 of component IC2, and terminal P1 of component IC5.

As shown in FIG. 16, these nets are shown in one straight line. The circuit boards and components which are displayed with the nets are shown in the same ratio of the actual places, configurations and sizes. According to the conventional apparatus, the mother board and the substrates are displayed on different display units and display places. So one net between the mother board component and the substrate component is not shown in one straight line. But according to the present apparatus, the best routing paths can be detected accurately and within a short time.

<Allocating terminals on the substrate>

(Step 1502) In order to interconnect the substrate components and the mother board components, it is necessary to lay out routing paths. So the designer allocates terminals for each net. Normally, the substrates terminals are allocated in a certain way so that the routing paths becomes the shortest.

Figure 17:
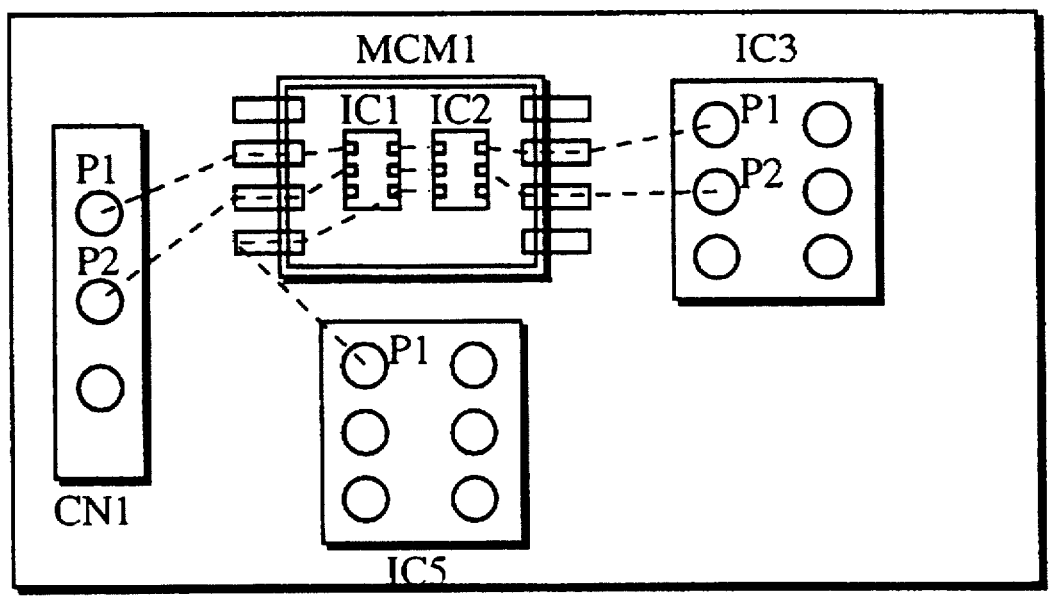
FIG. 17 is an example of nets which are via substrate components.

Specifically, by using the input unit 210, the designer designates one net and one terminal on the substrate which seems best for the routing of the net. Then the net display control unit 250C controls the display unit 260 to display a line interconnecting component terminals displayed on the diagram displayed via designated substrate by the layout data display control unit 250A. FIG. 17 shows the nets allocated an the substrate terminals displayed on the display unit 260.

<Routing on the substrate>

Figure 18:
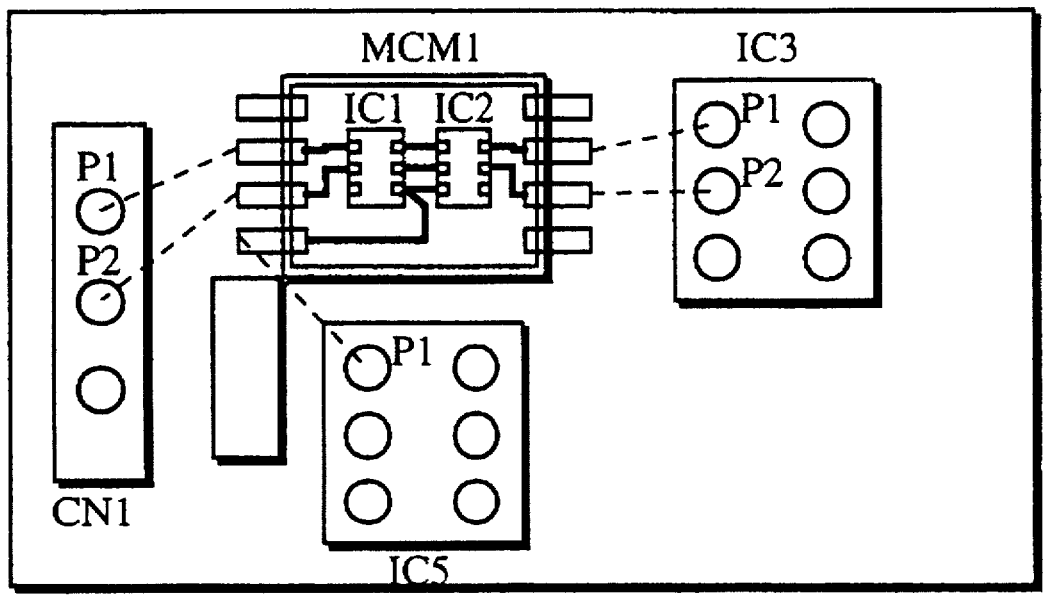
FIG. 18 is an example of the layout data right after the routing on the substrate is completed.

(Step 1503) After terminals are laid out on the substrate, routing for the substrate is started. First, one net and its coordinate which shows the routing paths are designated. According to the designation, the substrate routing unit 223B creates the data in the layout data storage unit 240A so that the routing path interconnecting the given substrate terminal and the given component terminal on the substrate is laid out on the substrate. The edited layout data is displayed on the display unit 260 by the layout data display control unit 250A. FIG. 18 shows an example on the display unit 260 after the routing is completed on the substrate.

Automatic routing method like line search method and maze method can be used. But the automatic routing method is not the theme of the present apparatus, so the details are not explained in the present application.

<Routing on the mother board>

Figure 19:
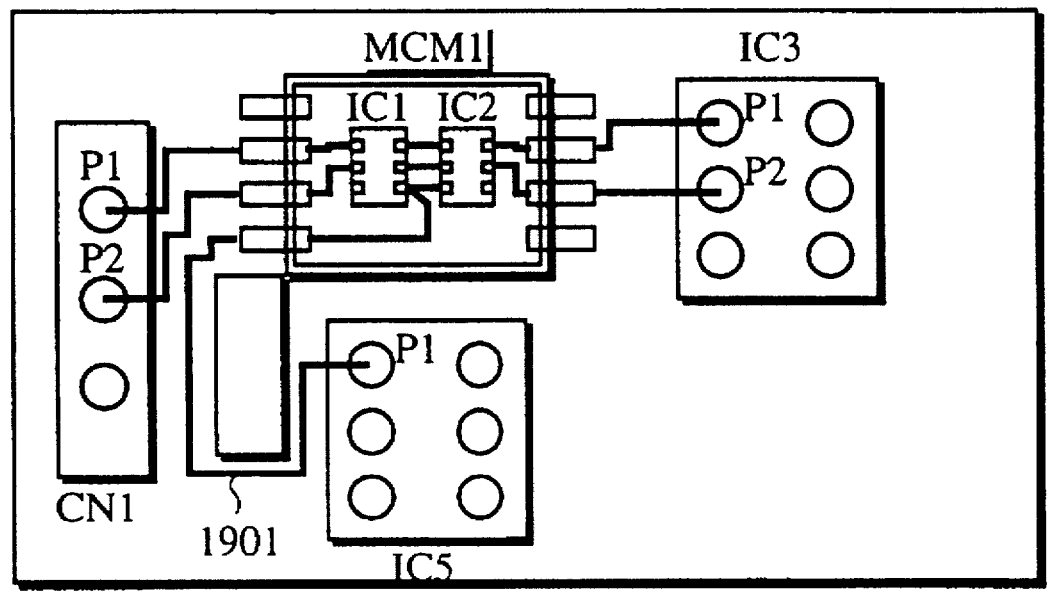
FIG. 19 is an example of the layout data right after the routing on the mother board is over.

(Step 1504) After the routing on the substrate is completed, the designer starts routing for the mother board. The substrate is regarded as one component and treated in the same way as the other general components. The routing is carried out in the same way as it is carried out for the substrate except for only one thing; the data stored in the layout data storage unit 240A is edited by the mother board placement unit 223. FIG. 19 shows an example on the display unit 260 when the routing on the mother board is completed.

<Evaluation of routing>

(Step 1505) The designer evaluates the appropriateness of the routing after a series of routings for the substrate and for the mother board are completed.

For example, in the routing in FIG. 19, the length of the routing path 1901 is rather long.

(Step 1506) The designer judges that this routing should be changed. In such a case, it is necessary to go back to Step 1502 and change the allocation of the substrate terminals. That is to change the routing path on the substrate so that the routing paths on the mother board becomes shorter.

Figure 20:
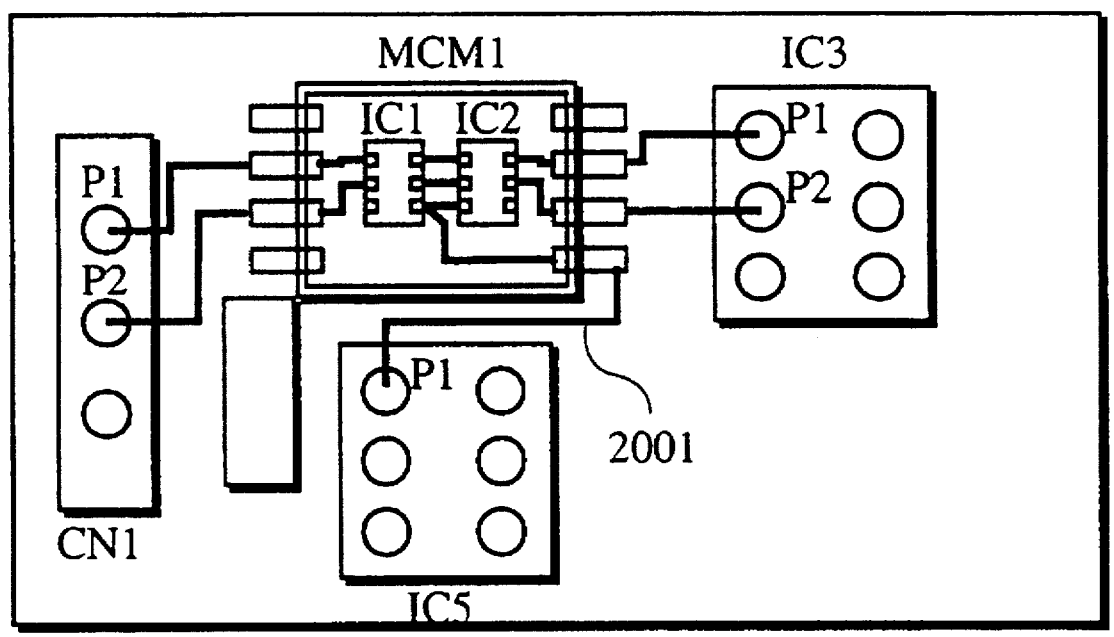
FIG. 20 is an example of the layout data in time of changing a routing path on the mother board.

First, in order to change the routing path 1901 in FIG. 19, the routing path which are interconnecting IC1 on the substrate and a connector terminal has to be changed so that it connects the IC1 and another connector terminal. FIG. 20 shows the changed routing path. As illustrated, the length of routing path becomes shorter.

By using the input unit 210, changing routing path is carried out interactively with the present apparatus through the display unit 260. The layout data display unit 250A displays the data stored in the layout data storage unit 240A on the layout unit 260 so that each circuit board with components placed and the routing paths laid out is displayed in the same place with the same ratio of the sizes of the actual circuit boards, components and routing paths. The routing paths which need to be changed can be detected immediately, enabling the designer to think how the routing path should be changed.

<Data output>

(Step 807) When the layout designing is completed, the designer stores the already edited layout data in the external storage unit 230 and outputs the data to a CAM apparatus and the simulator. The output unit 225 outputs the data stored in the layout data storage unit 240, which shows the places for component placement, placement sides and angles, routing places and sides, and through hole places on each circuit board.

<Layout data display control unit 250A>

As mentioned above, the layout data display control unit 250A and the net display control unit 250C play important roles. That means the designer can carry out the layout designing efficiently by these display control units as the circuit boards, components, routing paths, terminals and nets are displayed on the display unit 260 in the state which is similar to the actual layout.

Figure 21:
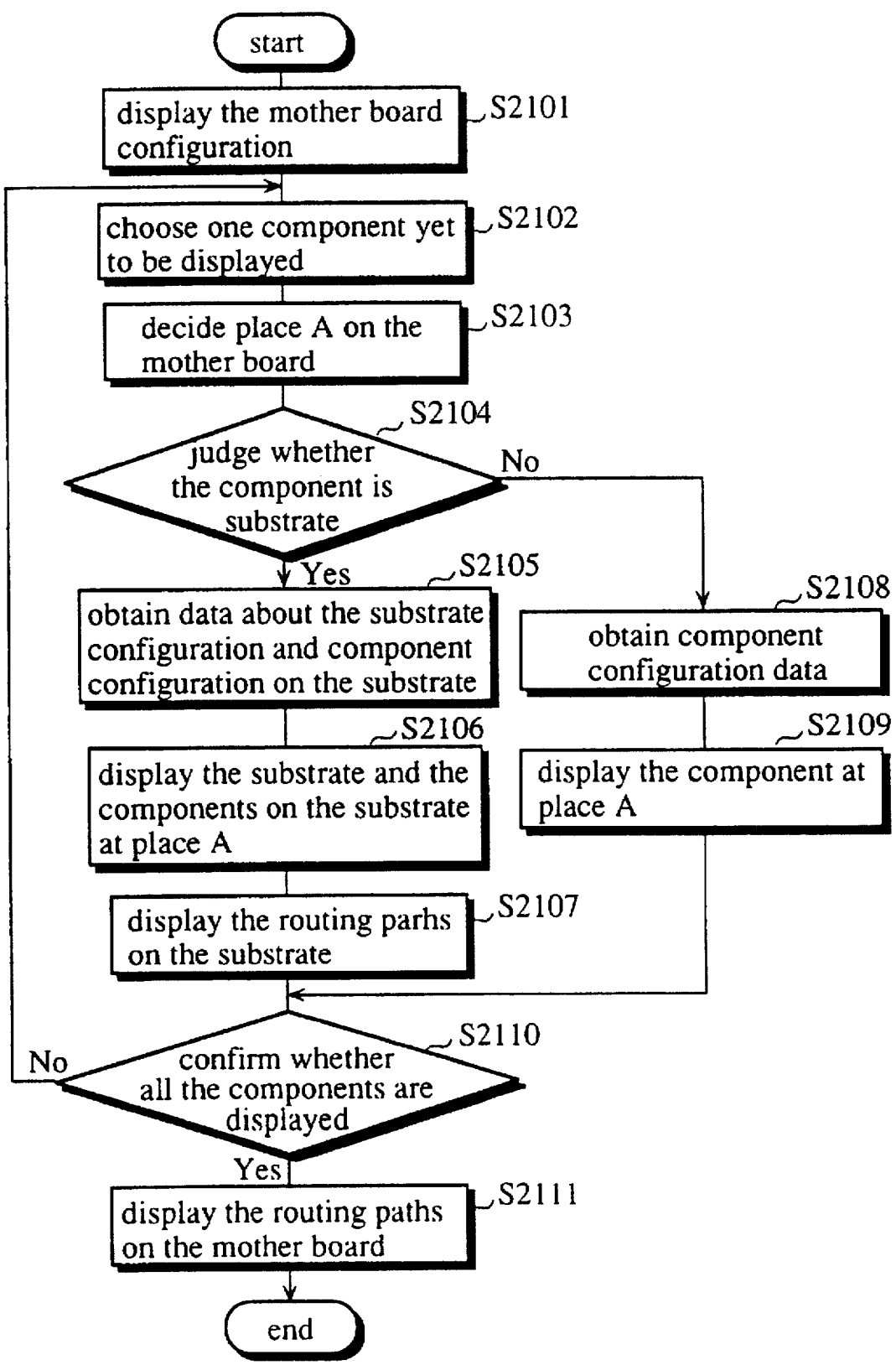
FIG. 21 is a flow chart which shows operations of a layout data display control unit 250A.
Figure 22:
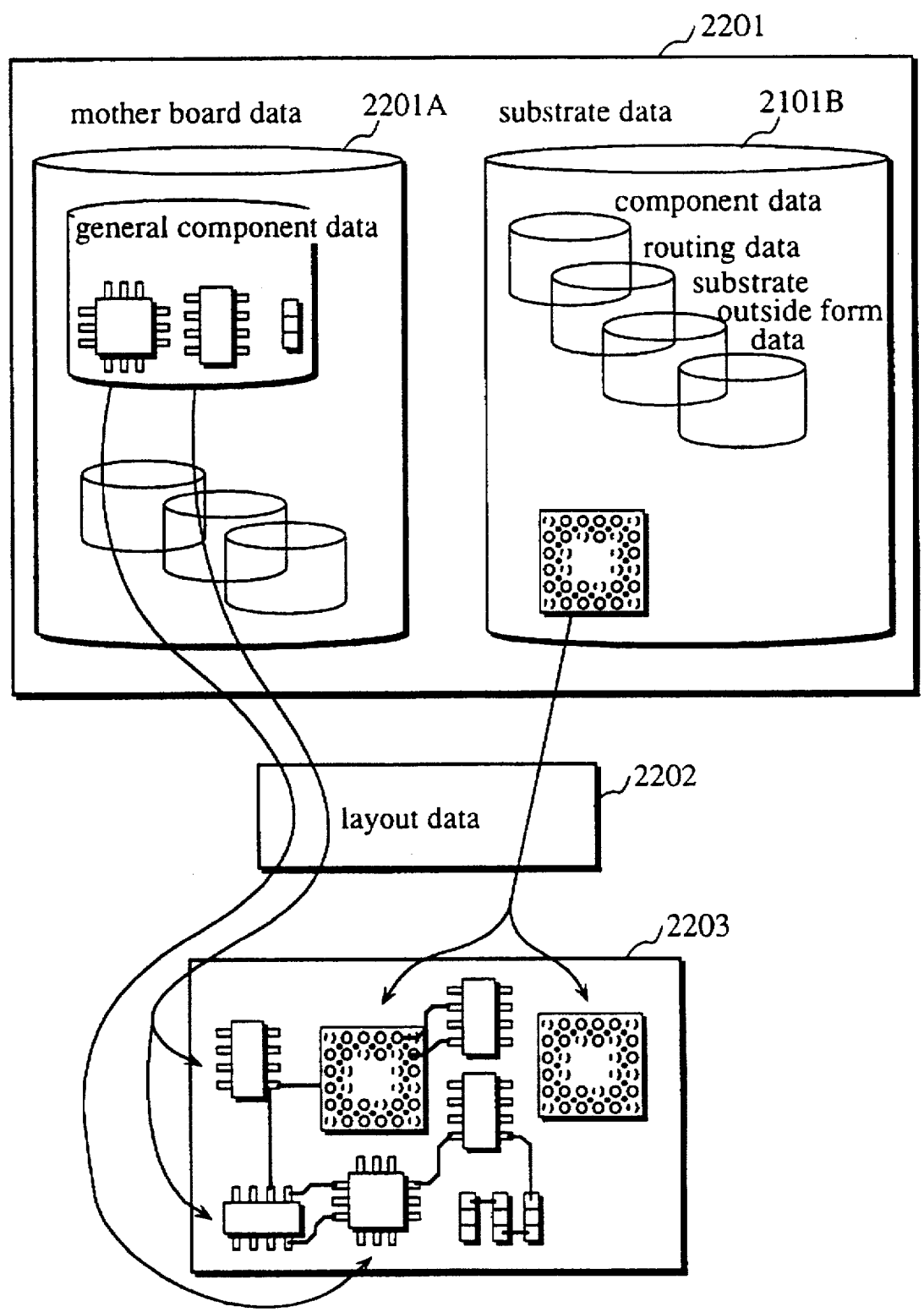
FIG. 22 is an explanation of operations of the layout data display control unit 250A.

The following are the details of the display control units. FIG. 21 shows a flow chart of the operation of the layout data display control unit 250A. FIG. 22 shows the component configuration data 2201 stored in the component configuration data storage unit 230C, the layout data 2202 in the layout data storage unit 240A, and the content of the display unit 260. FIG. 22 means that the layout data display control unit 250A is referring to the component configuration data 201 in time of displaying the content of the layout data 2202 on the display unit 260.

The following is the explanation of the layout data display control unit 250A according to the flow chart in FIG. 21.

(Step 2101) The layout data display control unit 250 controls the display unit 260 to display the mother board configuration based on the layout data 2202, (Step 2102) chooses one component yet to be displayed in order to display the laid out components successively, (Step 2103) obtains the place information including the angles and sides of the mother board components and decides place A, (Step 2104) and judges whether the component is the substrate or not.

(Step 2105) If the component is judged to be the substrate, the layout data display control unit 250A obtains information about the substrate configuration and component configuration on the substrate from the substrate data 2201B stored in the component configuration data 2201 based on the corresponding layout data 2202.

(Step 2106) displays the substrate and the components on the substrate on the display apparatus 260, (Step 2107) and displays the routing paths on the substrate.

(Step 2108) If the component is judged not to be the substrate, the layout data display control unit 250 obtains information about the component configuration from the mother board data 2201A in the component configuration data 2201, (Step 2109) and displays the components at place A.

(Step 2110) The layout data display control unit 250 repeats the above mentioned processes for all components.

(Step 2111) If all components are displayed, lastly, the routings for the mother board are displayed.

As explained above, each substrate and the components on the substrates are displayed at the designated places. So the designer can understand the actual state of layout thoroughly and can easily decide the best placement and routing.

Also, the layout data 2202 in the layout data storage unit 240A and the component configuration data 2201 in the component configuration data storage unit 230C are independent. When both data are displayed, the latest component configuration data is refereed. So the component configuration based on the latest component configuration data 2201 is displayed. Therefore, apart from the already completed layout designing, component configuration data 2201 can be changed.

<Net display control unit 250C>

Figure 23:
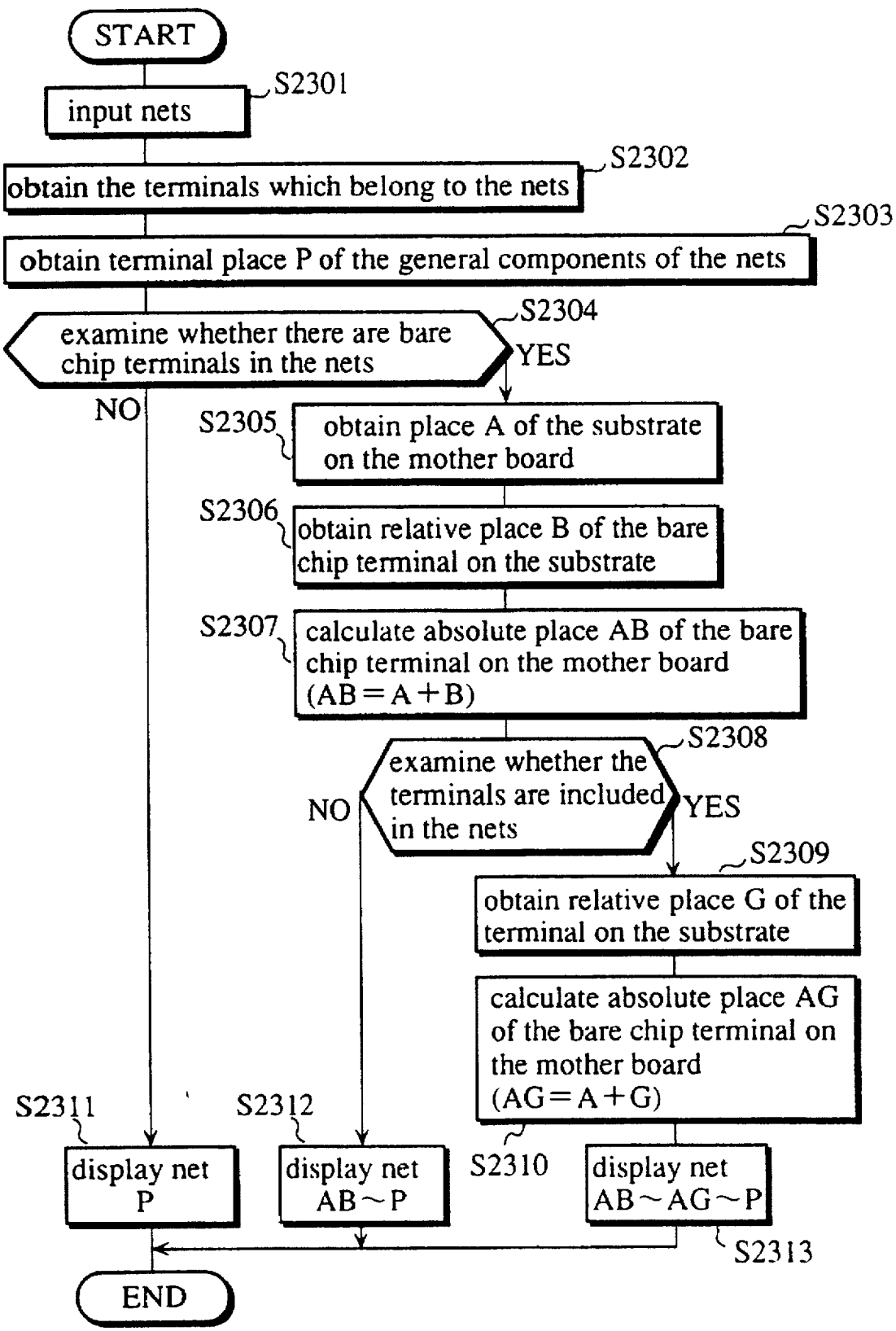
FIG. 23 is a flow chart which shows operations of a net display control unit 250C.

FIG. 23 is a flow chart of the operations of the net display control unit 250C. FIGS. 24–28 are for the explanations of the operations.

(Step 2301) First, by using the input unit 210, the designer designates nets which are to be displayed.

(Step 2302) By referring to the data in the net storage unit 240, the net display control unit 250C obtains the terminals which belong to the nets.

(Step 2303) Next the net display control unit 250 obtains the general component terminals and decides place P, the place on which the terminal is placed on the mother board. If there are a plurality of Ps, they are named as P1, P2 . . . The general components are components placed on the mother board except for the substrate.

(Step 2304) The net display control unit 250 examines whether there are bare chip terminals in the terminals which belong to the inputted nets.

(Step 2305) If there are bare chip terminals, the net display control unit 250 obtains the place including the angles and sides of the substrate on the mother board, the substrate on which the bare chips are laid out and decides place A. If there are a plurality of As, they are named as A1, A2, . . .

(Step 2306) From the design data of the substrate, the net display control unit 250 obtains the relative position of the bare chip terminals on the substrate and decides place B. If there are a plurality of Bs, they are named as B1, B2, . . .

(Step 2307) From A and B, the net display control unit 250 calculates the absolute places of the bare chip terminals on the mother board in view of angles and sides and decides place AB. If there are a plurality of ABs, they are named as A1B1, A1B2, . . . ,A2B1 . . .

(Step 2308) The net display control unit 250 examines whether the substrate terminals are included in the nets.

(Step 2309) If terminals are included in the nets, the net display control unit 250 obtains the relative place of the substrate terminal from the design data of the substrate and decides place G. If there are a plurality of Gs, they are named as G1, G2, . . . .

(Step 2310) The net display control unit 250C calculates the absolute place of the bare chip terminals on the mother board in view of angles and sides from A and G and decides place AG. If there are a plurality of AGs, they are named as A1G1, A1G2, . . . , A2G1, . . .

Figure 24:
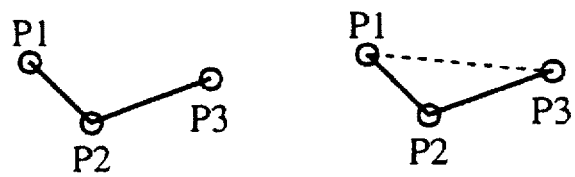
FIG. 24 is a display example of nets between general component terminals.

(Step 2311) From all the judgement above, if only general component terminals are included in the net, that means if there is no bare chip terminals in the terminals which are included in the net inputted in Step 2304, only that net is displayed. The display of the net including only the general component terminals is the line segment between each terminal included in the net. In order to avoid the complexity of the display, the shortest line segments are displayed first. And the line segments between the terminals which are already interconnected with the line segment are not shown. For example, as illustrated in FIG. 24, the line segment P1–P2, and P2–P3 are displayed, but P1–P3 are not displayed.

(Step 2312) If general component terminal and the bare chip terminal except for the substrate terminal are included in the net, that means if there is no substrate terminals in the terminals which belong to the net in Step 2308, that net is displayed.

Figure 25:
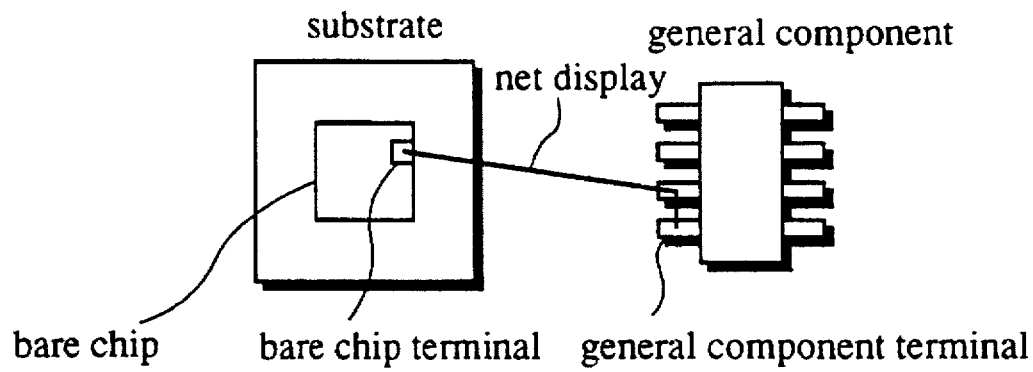
FIG. 25 is a display example of a net between a bare chip terminal and a general component terminal.

As illustrated in FIG. 25, the net is displayed in a line segment while the place of bare chip terminals are treated in the same way as the place of the general component terminals.

Figure 26:
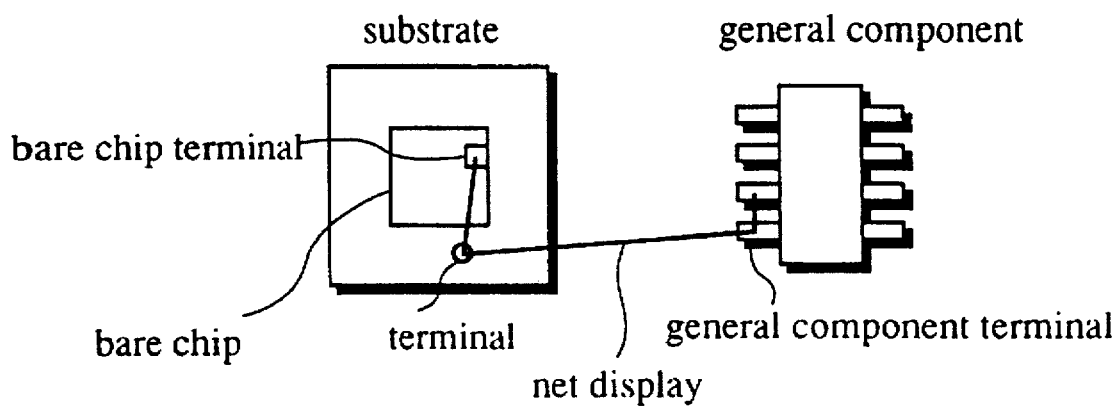
FIG. 26 is a display example of a net which is via a substrate terminal.

(Step 2313) If the net includes the general component terminals, bare chips, terminals, substrate terminals, the net is displayed after Step 2310. As illustrated in FIG. 26, the display net interconnecting the bare chip terminal and the substrate terminal and the display net interconnecting the substrate terminal and the general component terminal are calculated separately, so that not display net the interconnects the bare chip terminal and the general component terminal. This is because the bare chip terminal and the general component terminal are interconnected always through the substrate terminal, so the net should also be displayed through the substrate terminal. Different types of lines and colors can be used to distinguish between the net display between the bare chip terminal and the substrate terminal and the net display between the substrate terminal and the general component terminal.

Figures 27, 28:
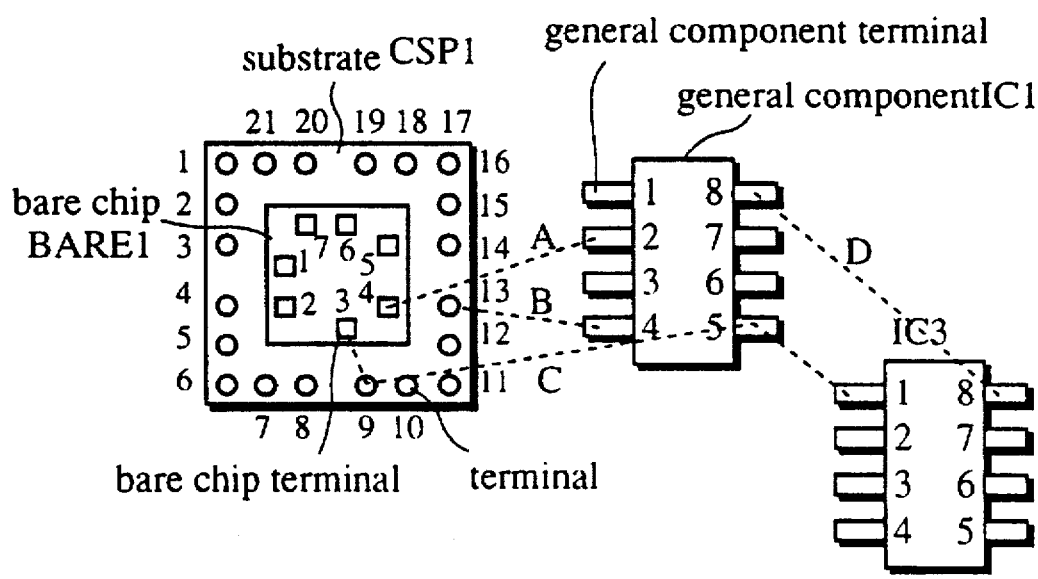
FIG. 27 is an example of a table which shows the net in the net storage unit 240C.
FIG. 28 is a display example of various nets.

FIG. 27 shows an example of the above connection data. Net A shows an interconnection between the bare chip terminal and the general component terminal. The substrate terminal is yet to be decided. Net B shows the interconnection between the bare chip terminal and the general component via the substrate terminal. Like net C, the number of terminals for each category could be more than one. Net D shows only the interconnection between the general components. The net display control unit 250C displays the nets on the display unit 260 as illustrated in FIG. 28.

<Effects>

The present apparatus carries out layout designing for the mother board and for the substrate at the same time, unlike the conventional designing apparatus. The circuit board, components, routing paths, terminals and nets displayed on the display unit 260 so that they are laid out at the designated places keeping a ratio of the sizes and configurations. So efficient designing can be realized.

(Embodiment 2)

Embodiment 2 shows an example of giving a equal attribute to a plurality of substrates using the layout designing apparatus for circuit boards according to an example of the present apparatus.

Figure 29:
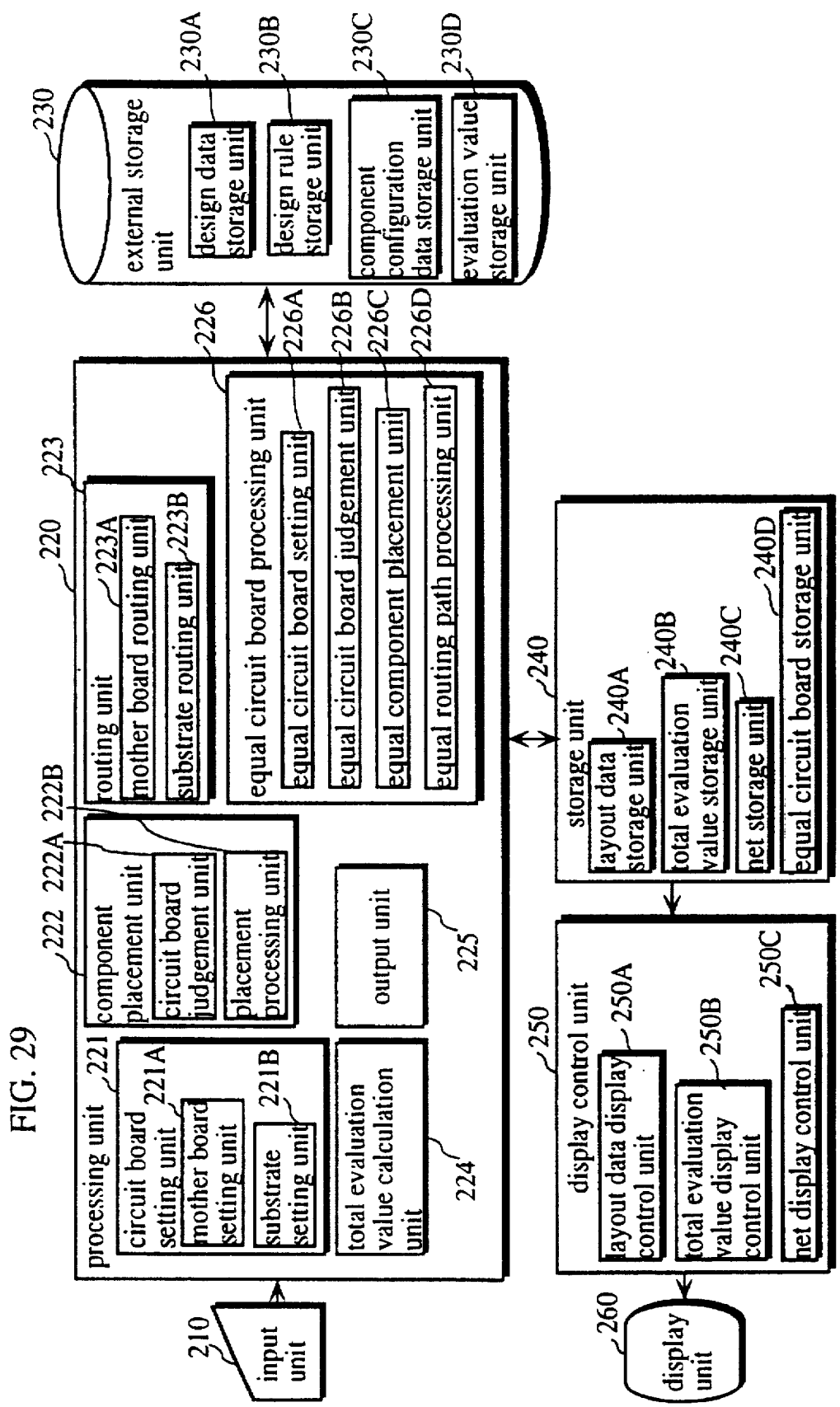
FIG. 29 is a block diagram which shows construction of Embodiment 2 of the present invention.

FIG. 29 shows a block diagram of the construction of the layout designing apparatus for circuit boards according to Embodiment 2. The difference between Embodiment 1 and Embodiment 2 is that in the Embodiment 2, an equal substrate board processing unit 226 is added to the processing unit 220 and an equal substrate storage unit 240D is added to the storage unit 240.

The equal substrate storage unit 240D stores information which identifies the substrates which had been designated as equal by the designer.

The equal substrate processing unit 226 further includes an equal substrate setting unit 226A, an equal substrate judgement unit 226B, an equal component placement unit 226C, and an equal routing path layout unit 226D.

The equal substrate setting unit 226A stores information in the equal substrate storage unit 240D, the information identifying the substrates designated by the input unit 210.

The equal substrate judgement unit 226B judges whether the substrate used for placement or routing is one of the equal substrates based on the information in the equal substrate storage unit 240D.

The equal component placement unit 226C edits the data in the layout data storage unit 240A so that when the equal substrate judgement unit 226B judges that one of a plurality of equal substrates has components placed upon it, the counterpart components are placed on the same place as the rest of the equal substrates.

The equal routing path layout unit 226D edits the data in the layout data storage unit 240A so that when the equal substrate judgement unit 226B judges that one of a plurality of equal substrates has a routing path laid out upon it, the counterpart routing path is laid out on the same area of the rest of the substrates.

Figure 30:
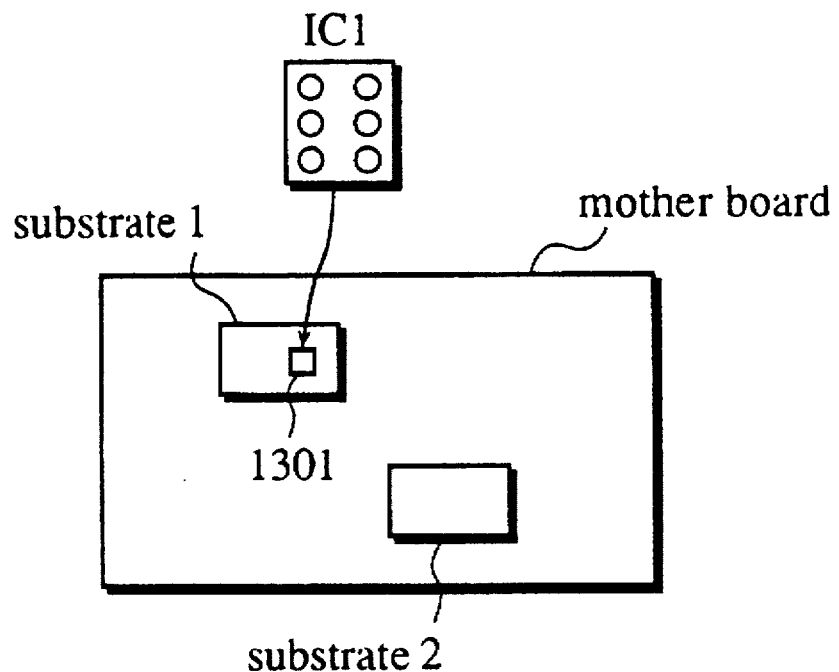
FIG. 30 is a display example of the layout data in time of placing one component yet to be placed on the substrate.
Figure 31:
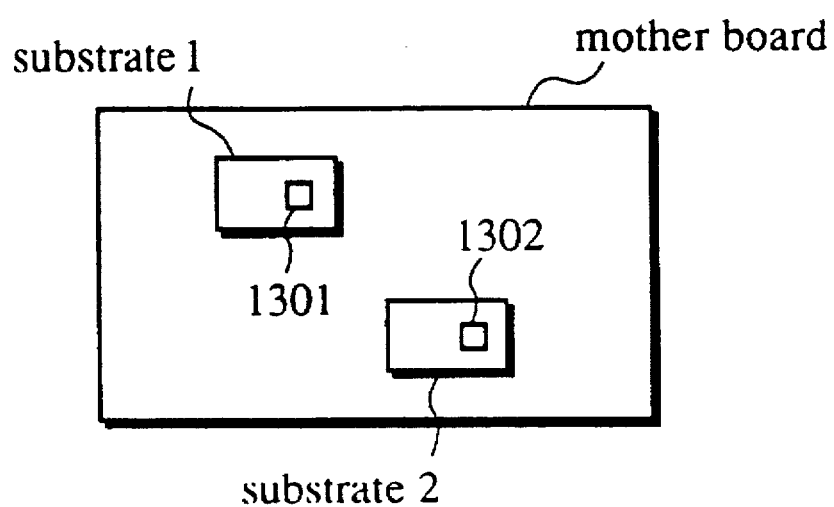
FIG. 31 is a display example of the layout data right after one component yet to be placed is placed on the substrate.

FIGS. 30 and 31 explains embodiments.

First the designer designates that the substrates 1 and 2 have equal attributes. The equal substrate setting unit 226A stores this information in the equal circuit board storage unit 240D.

Next, when the designer places components on the substrate 1, the equal substrate judgement unit 226B judges that the substrate 2 exists; the substrate which has the equal attribute as the substrate 1, refereeing to the data in the equal substrate storage unit 240D. Then the equal component placement unit 226C automatically places the component on the corresponding place on the substrate 2. FIG. 31 shows the result. In this way, equal components can be placed at one time on a plurality of substrates. In case of changing the placed components onto another place, the same effect can be obtained.

The same effect can be obtained in case of laying out substrates having the equal attributes. In such a case, the equal routing path layout unit 226D can be used for the equal component placement unit 226C.

(Embodiment 3)

Embodiment 3 shows an example of deleting unnecessary routing paths using the layout designing apparatus for circuit boards according to an example of the present apparatus.

Figure 32:
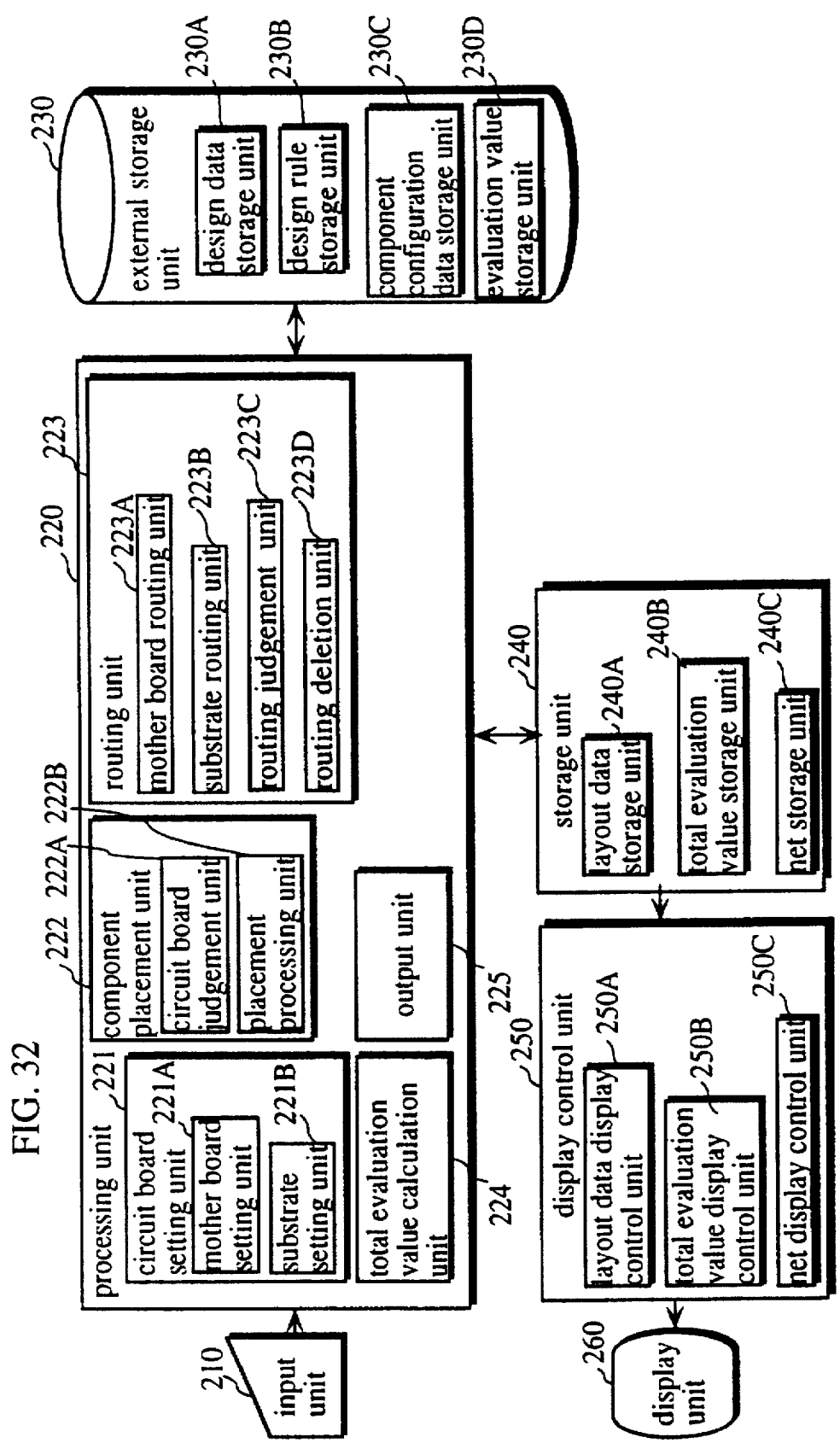
FIG. 32 is a block diagram which shows construction of Embodiment 3 of the present invention.

FIG. 32 shows a block diagram of the constitution of the layout designing apparatus for circuit boards according to Embodiment 3. The difference between Embodiment 1 and Embodiment 3 is that in the Embodiment 3, a routing judgement unit 223C and a routing path deletion unit 223D are added to the routing unit 223.

The routing judgement unit 223C judges whether the substrate terminal designated by the input unit 210 is already used for the routing.

The routing path deletion unit 223D edits the data in the layout data storage unit 240A, in case only the terminal has already been used for routing, so that the routing path for the terminal is deleted.

Figure 33:
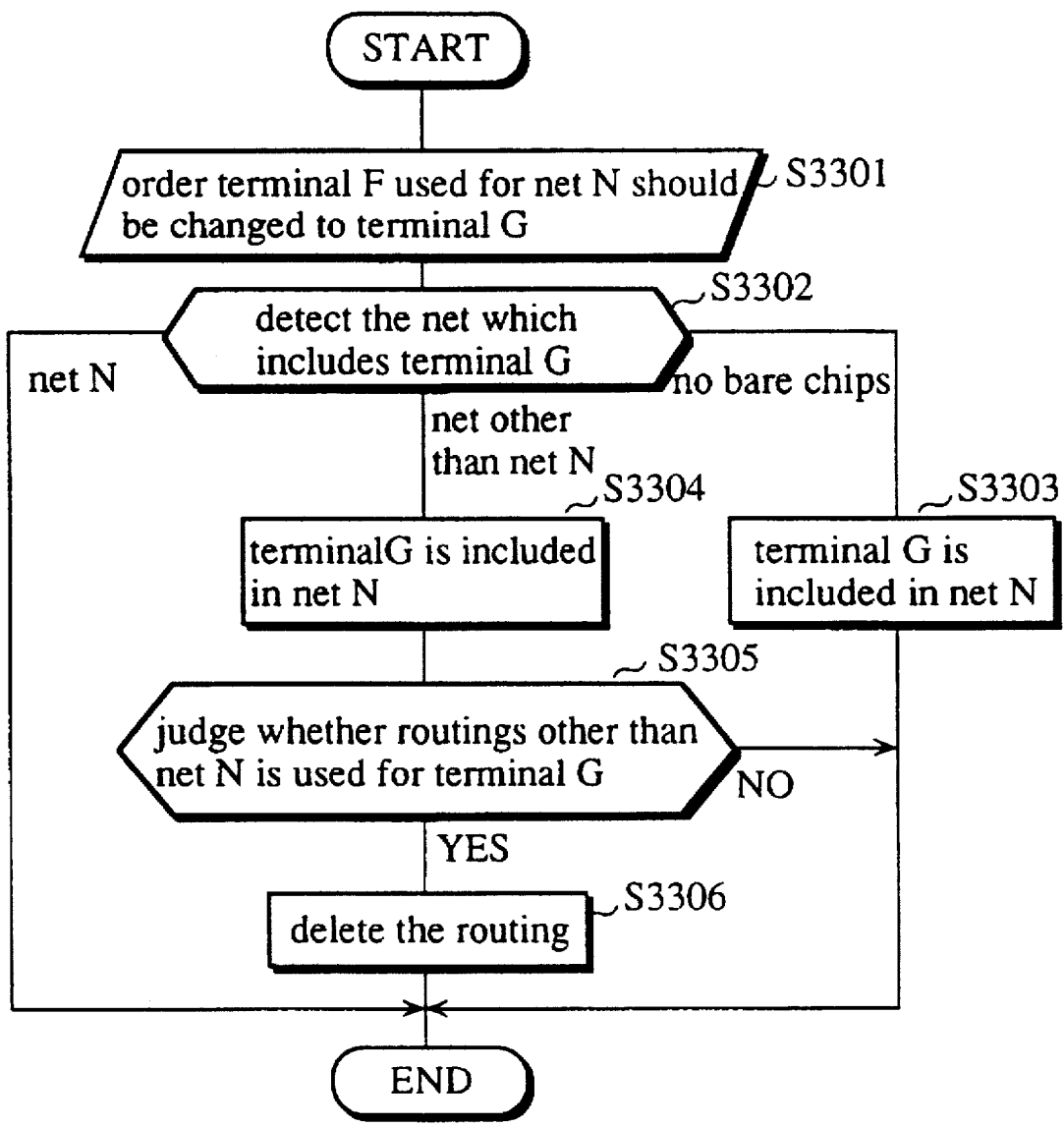
FIG. 33 is a flow chart which shows operations of Embodiment 3 of the present invention.
Figure 34A:
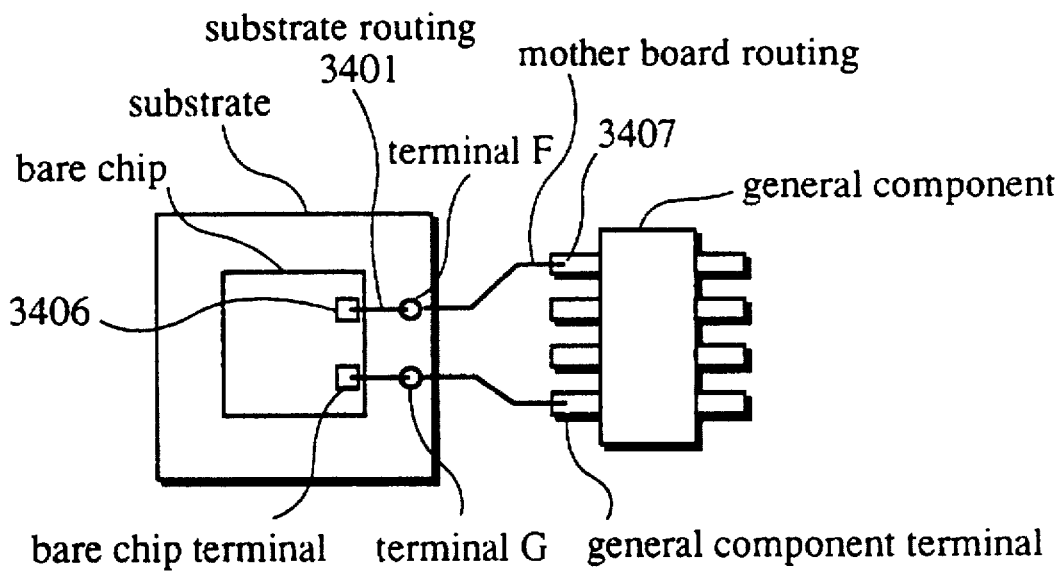
FIG. 34A is a display example of layout data before changing a terminal which is already used for routing.
Figure 34B:
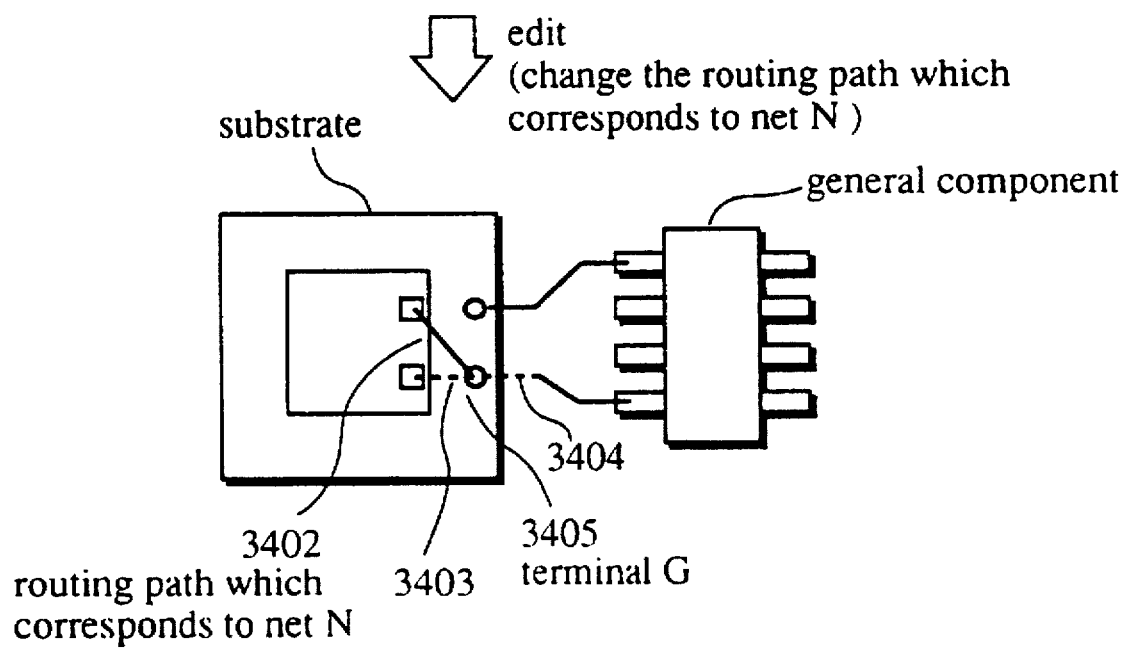
FIG. 34B is a display example of layout data after changing the substrate terminal.

FIGS. 33 and 34 explains the embodiments. FIG. 33 is a flow chart which shows the operations in the routing judgement unit 223C and the routing path deletion unit 223D. FIGS. 34A and 34B show a state before and after changing the routing paths respectively.

In FIG. 34A, the routing path from the bare chip terminal 3406 on the substrate to the general component terminal 3407 on the mother board via terminal F on the substrate (this routing path corresponds to Net N) is laid out. This routing path is going to be changed so that it is laid out from the bare chip terminal 3406 on the substrate from a certain component terminal 3407 on the mother board via terminal G on the substrate. In order to realize the above routing path, the following steps are taken.

(Step 3301) Using the input unit 210, the designer orders that terminal F used for net N should be changed to terminal G.

(Step 3302) The net which includes terminal G is detected.

(The flow from Step 3302 to the left side) When net N includes terminal G, special processing is not carried out.

(Step 3303) When terminal G is not included in any net, more specifically, when the substrate terminal is not used for the routing, terminal G is included in net N, and the process is over.

(Step 3304) When terminal G has been included in a net other than net N, for example net X, terminal G is included in net N.

The above mentioned processing is carried out by the substrate routing unit 223B.

(Step 3305) Next, the routing judgement unit 223C judges whether routings other than net N is used for terminal G. In such a case, terminal G is included in net X so it is highly probable that the routing which corresponds to net X has been already applied.

When routing other than net N has not been applied to terminal G, the processing is over.

(Step 3306) When the routing other than net N is already used for terminal G, the routing path deletion unit 223D edits the data in the layout data storage unit 240A so that the routing path for the terminal is deleted. As shown in FIG. 34B, routing path 3403 on the substrate and routing path 3404 on the mother board are deleted, and terminal F becomes the state yet to be connected.

Changing the net for terminals on substrates can be carried out by command processing and the like.

Also the automatic routing process in the prior art can be applied to the routing process between the bare chip terminal on the substrate and the substrate terminal or the substrate terminal on the substrate on the mother board and general component terminal. According to the present embodiment, interconnection between terminals yet to be interconnected can be realized automatically.

<Effect>

When the terminal which has been already used for routing is designated for routing, that routing path is deleted. Therefore, miss design like terminal on one substrate being used for different net routings can be avoided.

(Embodiment 4)

Embodiment 4 shows an example of automatic interconnection between the component terminal on the substrate and the component terminal on the mother board using the layout designing apparatus for circuit boards according to an example of the present apparatus.

(Construction)

Figure 35:
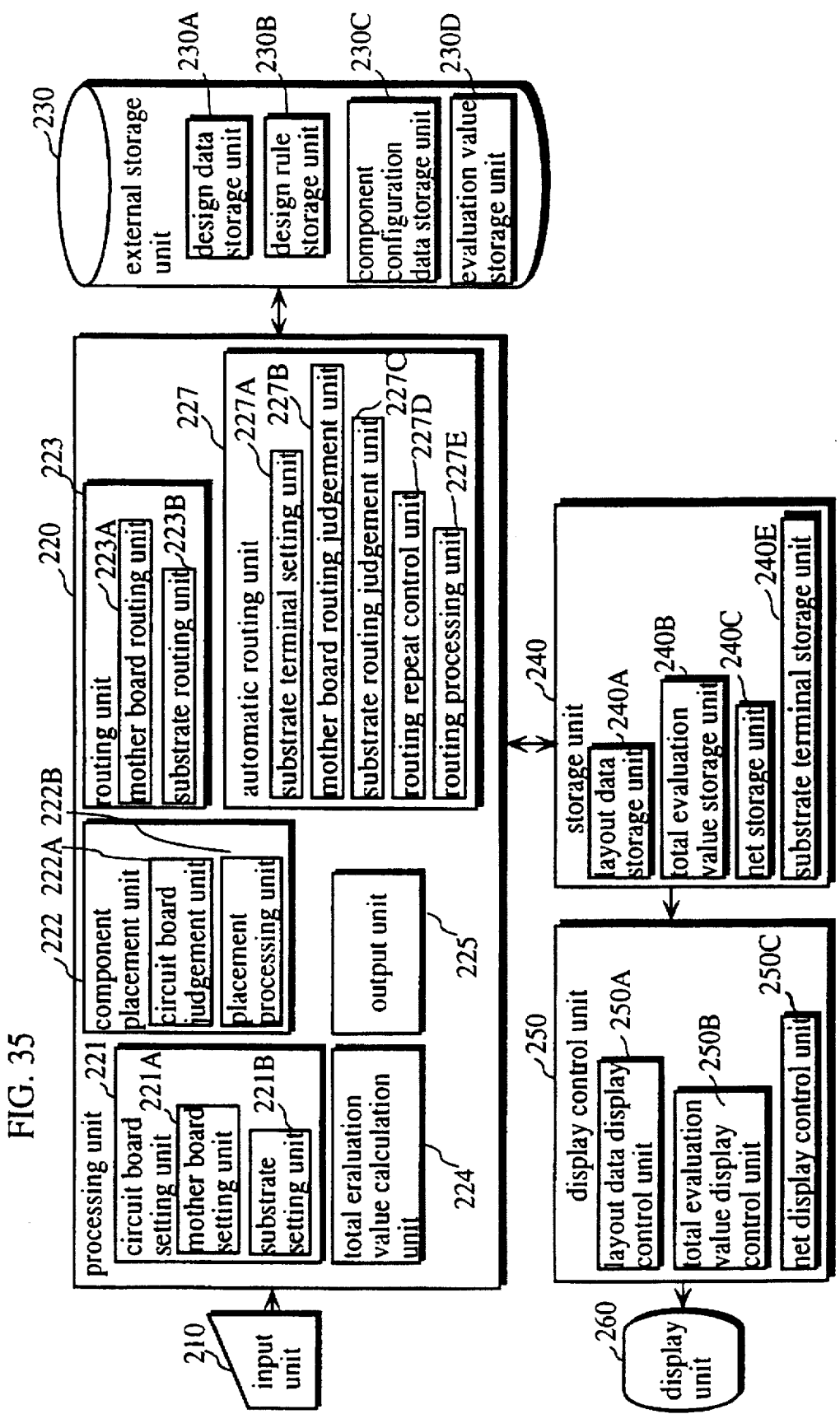
FIG. 35 is a block diagram which shows construction of Embodiment 4 of the present invention.

FIG. 35 shows a block diagram of the construction of the layout designing apparatus for circuit boards according to Embodiment 4. The difference between Embodiment 1 and Embodiment 4 is that in Embodiment 4, an automatic routing unit 227 is added to the processing unit 220 and a substrate terminal storage unit 240E is added to the storage unit 240.

The substrate terminal storage unit 240E stores information which identifies the substrate terminals which are to be used for automatic routing.

The automatic routing unit 227 further comprises a substrate terminal setting unit 227A, a mother board routing judgement unit 227B, a substrate routing judgement unit 227C, a routing repeat control unit 227D and a routing processing unit 227E.

Based on the data in the layout data storage unit 240A, the substrate terminal setting unit 227A stores information in the substrate terminal storage unit 240E, the information identifying all the substrate terminals for the net which is to be used for the automatic routing designated by the input unit 210 in the substrate terminal storage unit 240E.

The substrate routing judgement unit 227C chooses one substrate terminal from the substrate terminals stored in the substrate terminal storage unit 240E and judges whether it is possible to lay out the routing path on the substrate between the substrate terminal and the component terminal on the substrate for the net.

The mother board routing judgement unit 227B judges whether it is possible to lay out on the mother board the routing path between the substrate terminal chosen by the substrate judgement unit 227C and the component terminal on the mother board for the net.

When at least one of the substrate routing judgement unit 227C and the mother board routing judgement unit 227B judges "impossible", the routing repeat control unit 227D deletes the certain substrate terminal in the substrate terminal storage unit 240E and operates so that the processings in the substrate routing judgement unit 227C and the mother board routing judgement unit 227B are repeated, the certain substrate terminal being used for the judgement "impossible".

When the substrate routing judgement unit 227C and the mother board routing judgement unit 227B judge "possible", the routing processing unit 227E edits the data in the layout data storage unit 140A so that the routing paths are laid out on the mother board and on the substrate according to the judgement above.

(Operation)

Figure 36:
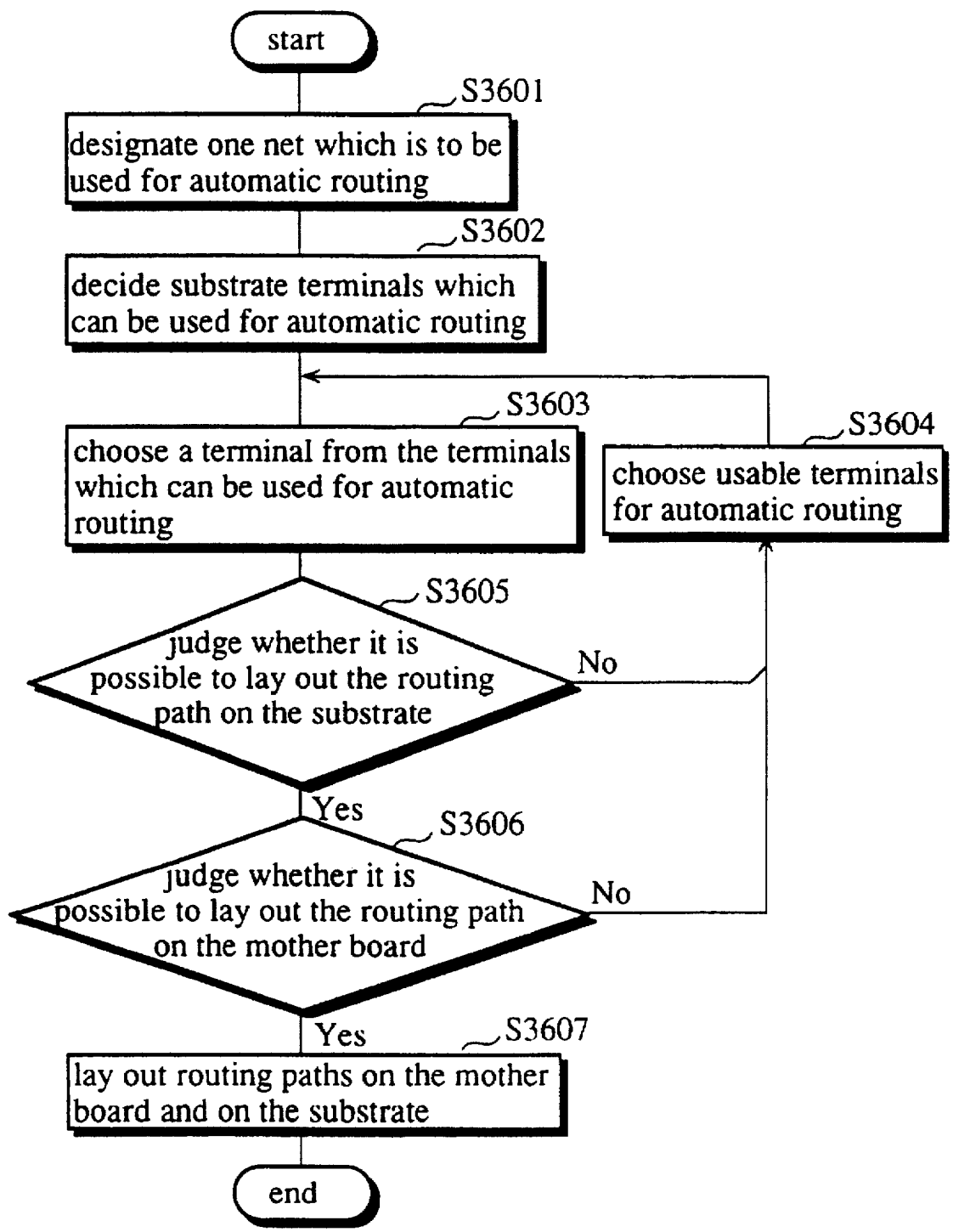
FIG. 36 is a flow chart which shows operations of Embodiment 4 of the present invention.

FIG. 36 shows the operations. The following steps are taken.

(Step 3601) The designer designates one net which is to be used for the automatic routing, the net chosen from the net storage unit 240C and interconnects substrate components and mother board components.

(Step 3602) The substrate terminal setting unit 227A stores information which identifies all the substrate terminals for the designated nets in the substrate terminal storage unit 240E.

(Step 3603) The substrate routing judgement unit 227C chooses one substrate terminal from the substrate terminal storage unit 240E. At this stage, in order to obtain the shortest routing paths, it is possible to choose first the substrate terminal which is closest to the net.

(Step 3605) Subsequently, the substrate routing judgement unit 227C judges whether it is possible to lay out the routing path which interconnects the substrate terminal and the component terminal on the substrate. This judgement is carried out by referring to the data in the layout data storage unit 240A to guarantee areas for the routing path on the substrate and check if the routing path crosses with other routing paths. Concretely, maze method and line search method can be used.

(Step 3606) The mother board routing judgement unit 227B judges whether it is possible to lay out on the mother board the routing path which interconnects the mother board terminal and the component terminal on the mother board.

(Step 3604) When at least one of the substrate routing judgement unit 227C and the mother board routing judgement unit 227B judges "impossible", the routing repeat control unit 227D deletes the certain substrate terminal in the substrate terminal storage unit 240E and operates so that the processings in the substrate routing judgement unit 227C and the mother board routing judgement unit 227B are repeated, the certain substrate terminal being used for the judgement "impossible".

(Step 3607) On the other hand, when the substrate routing judgement unit 227C and the mother board routing judgement unit 227B judge "possible", the routing processing unit 227E edits the data in the layout data storage unit 140A so that the routing paths are laid out on the mother board and on the substrate according to the judgement above.

As explained above, the substrate terminal for interconnecting the substrate component and the mother board component can be found and the routing path can be laid out automatically.

In case there is the substrate terminals which are already allocated before the automatic routing starts, the routing path is peeled off and the terminals are used for the trial of the above mentioned automatic routing. In such a case, the information about the peeled routing paths is stored in the storage unit 240, so the designer can lay out routing paths again later.

In Embodiment 4, automatic routing is for one net. But a plurality of nets can also be used.

<Example>

Figure 37:
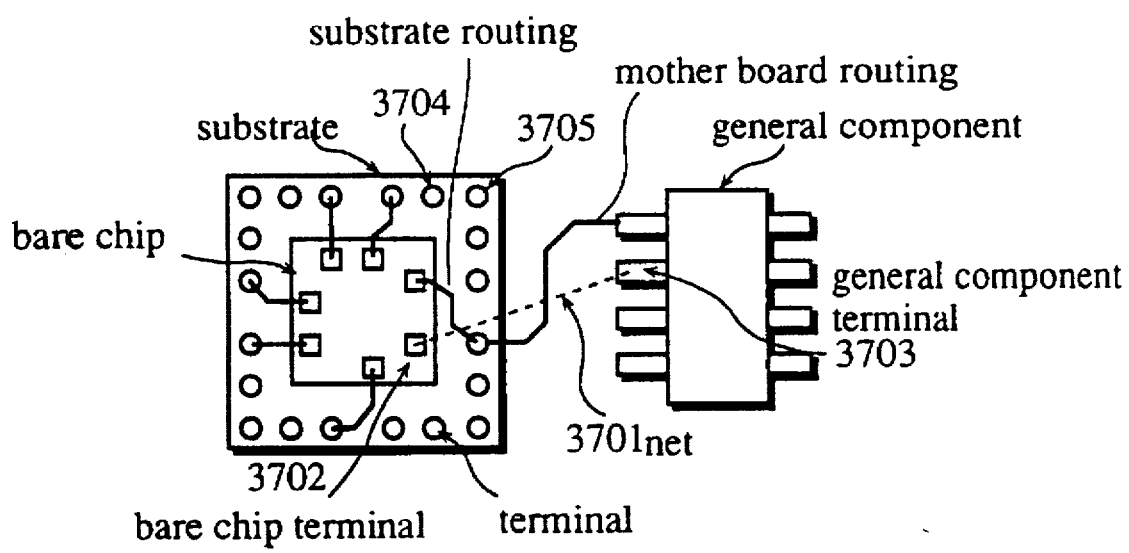
FIG. 37 is a display example of the layout data before automatic routing starts.

FIG. 37 shows the automatic routing and a display example in the display unit 260. Next steps are taken.

(Step 3601) The designer designates net 3701, which is between component terminal 3702 on the substrate and component terminal 3703 on the mother board, for automatic routing.

(Steps 3602–3603) Among the substrate terminals that can be used, one terminal, e.g. terminal 3704, is chosen.

(Step 3603) As illustrated in FIG. 37, the routing path between terminals 3702 and 3704 cannot be obtained.

(Steps 3604 and 3603) So, another terminal 3705 is chosen. The routing path cannot be obtained in this case neither.

Figure 38:
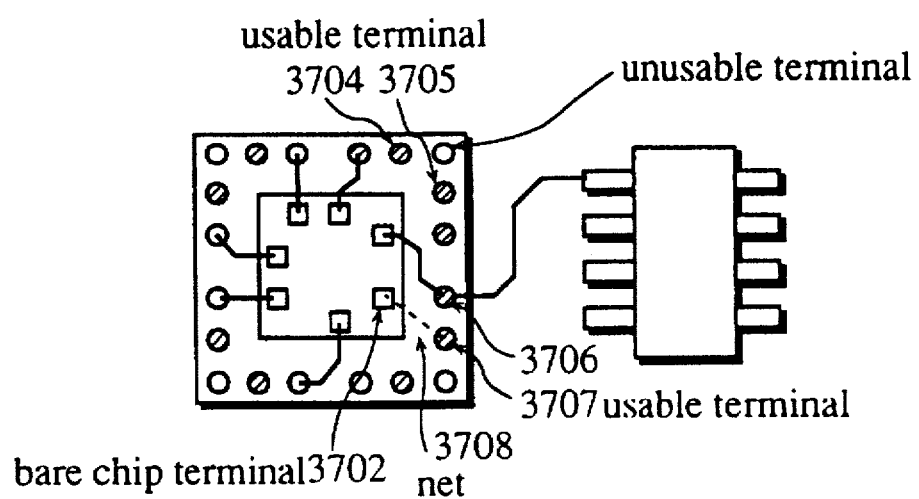
FIG. 38 is a display example of the layout data in case one substrate terminal is chosen.

(Step 3603) The terminal which is most suitable for automatic routing is sought successively and terminal 3707 is chosen as illustrated in FIG. 38.

(Step 3605) As illustrated in FIG. 38, the substrate routing judgement unit 227C judges whether it is possible to lay out the routing path between terminals 3702 and 3707.

(Step 3606) Likewise, the mother board routing judgement unit 227B decides it is possible to lay out the routing path between terminals 3703 and 3710.

Figure 39:
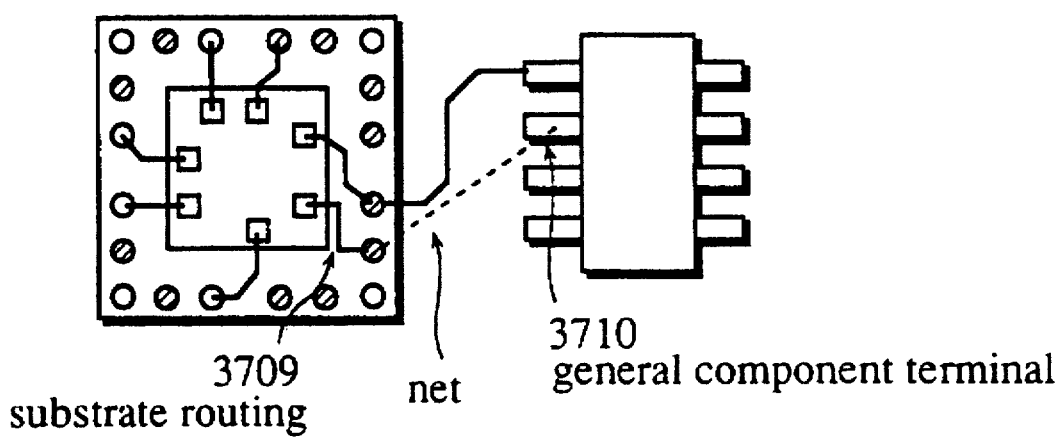
FIG. 39 is a display example of the layout data right after the automatic routing on the substrate is over.
Figure 40:
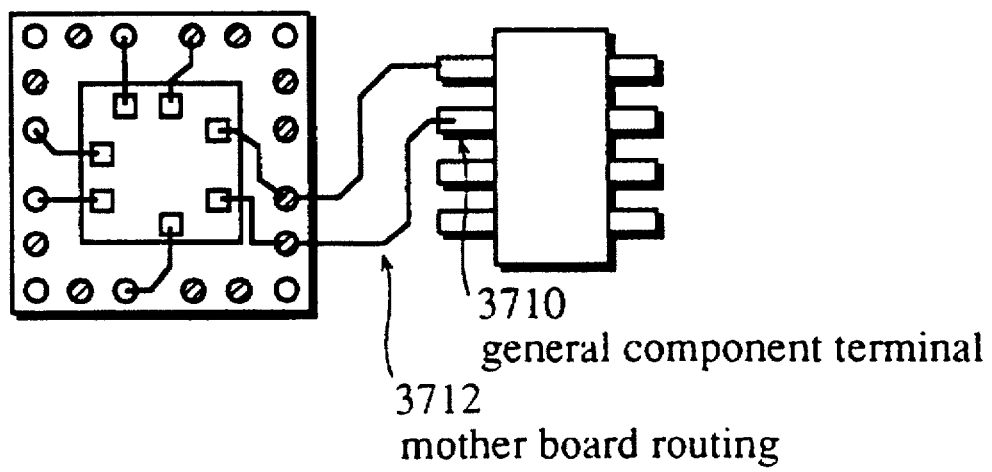
FIG. 40 is a display example of the layout data right after the automatic routing on the mother board is over.

(Step 3607) As a result, the routing path 3709 is laid out on the substrate (FIG. 39). The routing path 3712 is laid out on the mother board (FIG. 40).

<Effect>

According to the above embodiment, the best routing path between the substrate components and the mother board components can be laid out automatically. Therefore, time needed for laying out routing paths can be reduced greatly.

(Embodiment 5)

Embodiment 5 shows an example of classifying components by the kinds of circuit board, deciding the substrate configuration, and placing components on the mother board and on the substrate, all of which carried out automatically, using the layout designing apparatus for circuit boards according to an example of the present apparatus.

<Construction>

Figure 41:
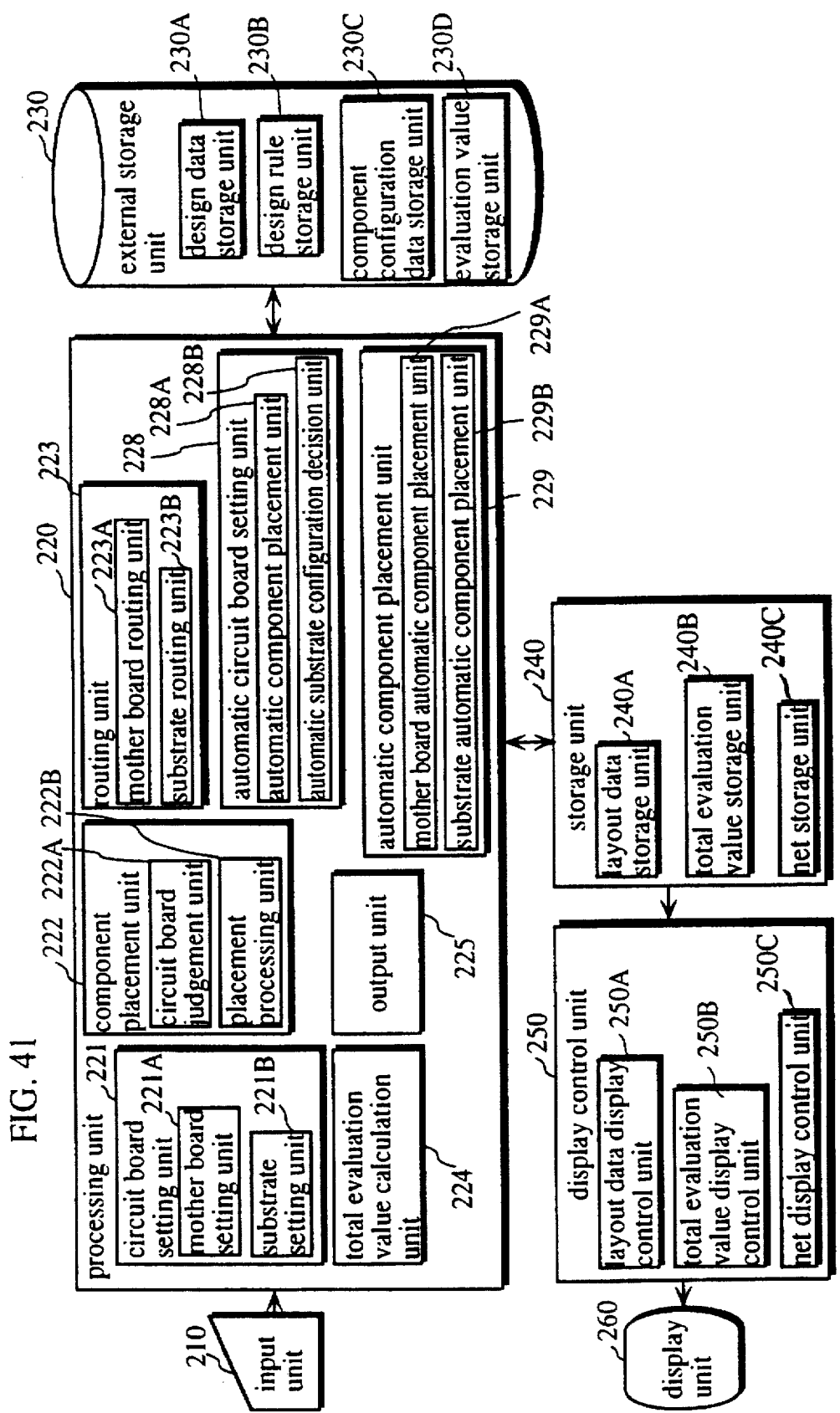
FIG. 41 is a block diagram which shows construction of Embodiment 5 of the present invention.

FIG. 41 shows a block diagram of the construction of the layout designing apparatus for circuit boards according to Embodiment 5. The difference between Embodiment 1 and Embodiment 5 is that in Embodiment 5 an automatic circuit board setting unit 228 and the automatic component placement unit 229 are added to the processing unit 220.

The automatic circuit board setting unit 228 further includes an automatic component classification unit 228A and an automatic substrate configuration decision unit 228B.

The automatic component classification unit 228A classifies the components into the components which are to be laid out on the substrate and components which are to be laid out on the mother board.

The automatic circuit board configuration decision unit 228B decides substrate configurations and allocates terminals.

The automatic component placement unit 229 further includes a mother board automatic component placement unit 229A and substrate automatic component placement unit 229B.

Based on the data in the design data storage unit 230A and the layout data storage unit 240A, the mother board automatic component placement unit 229A regards the designated substrate as one component and places that substrate on the mother board automatically. As a method for automatic placement, the well-known force placement method and the like are used.

Based on the data in the design data storage unit 230A and the layout data storage unit 240A, the substrate automatic component placement unit 229B places components on the substrate automatically. Generally, in a method for automatic placement, the relationship of places between the components which are to be placed automatically and other component terminals on the circuit boards which are to be interconnected with that component are taken into consideration. In the automatic placement in Embodiment 5, not only substrate components but also mother board components are also taken into consideration. If terminals are already allocated on the substrate, only substrate components and terminals are taken into consideration. At this time, if the equal substrate processing unit 26 designates that a plurality of substrates have the same attribute, all the substrate having the same attribute can also be taken into consideration.

<Operation>

FIG. 42 shows operations of the automatic circuit boards setting unit 228 and the automatic component placement unit 229.

Figure 42A:
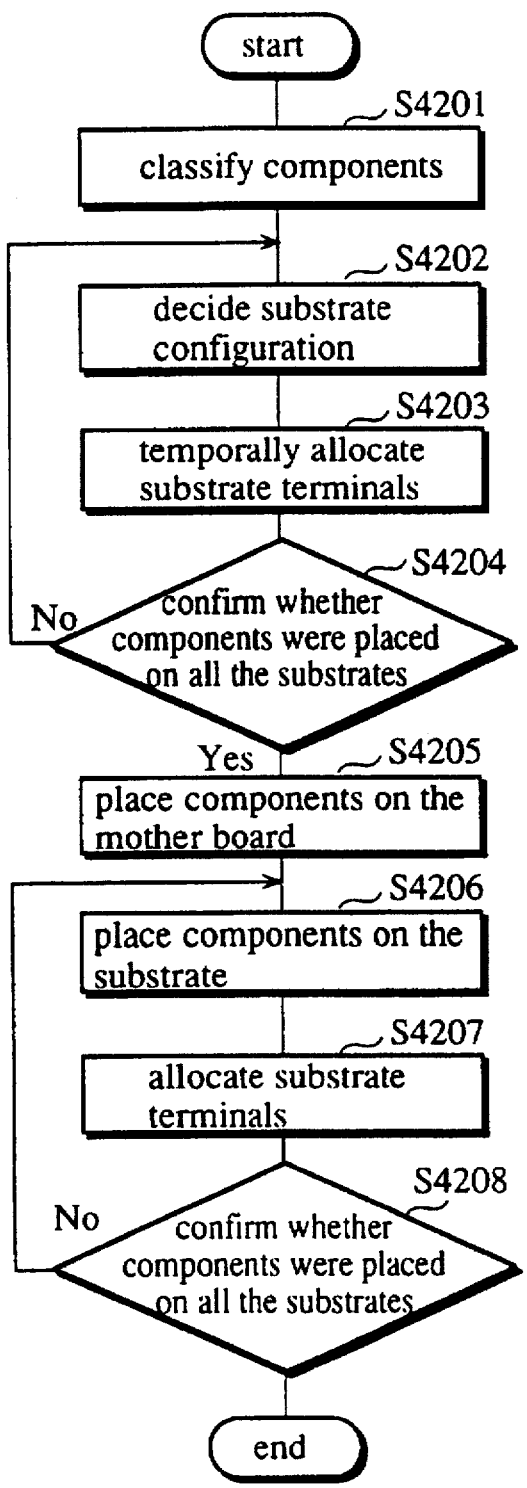
FIG. 42A is a flow chart of layout designing of Embodiment 5 of the present invention in which components are placed upon the substrate after components are placed upon the mother board.
Figure 42B:
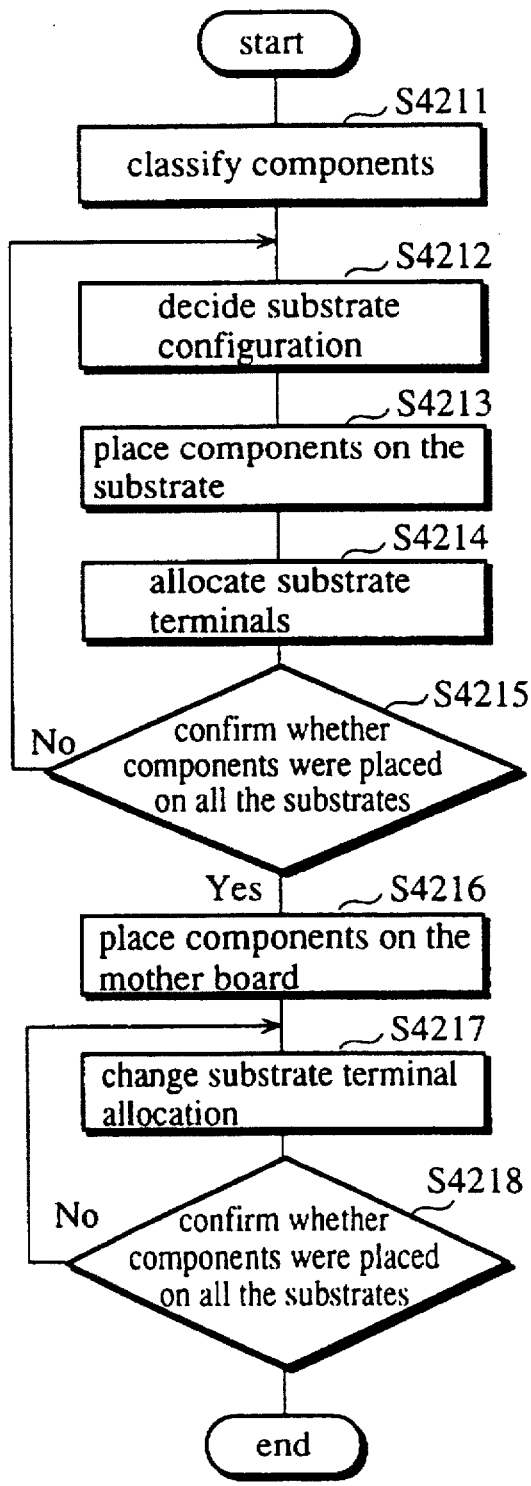
FIG. 42B is a flow chart of layout designing of Embodiment 5 of the present invention in which components are placed upon the mother board after components are placed upon the substrate.

In FIG. 42A, after the substrate is placed on the mother board, components are placed on the substrate. In FIG. 42B, after the components are placed on the substrate, the substrate is placed on the mother board.

The following passages explains FIG. 42. Next steps are taken.

(Step 4201) The automatic component classification unit 228A classifies the components into the components which are to be placed on the substrate and the components which are to be placed on the mother board. The number of substrate can be plural.

(Step 4202) The automatic substrate configuration decision unit 228B decides the substrate configuration. Then each substrate configuration and size can be obtained for placing all the necessary components.

(Step 4203) Next, the terminals are temporarily allocated on the mother board. This allocation is temporal for the automatic placement of the mother board substrate. The terminals can be allocated according to a net list or can be allocated in the center of the substrate intensively.

(Step 4205) The mother board automatic component placement unit 229A automatically places each substrate decided in the proceeding process on the mother board. At that time, each substrate can be treated in the same way as the other general components. The automatic placement method being used is the well-known force placement method and the like.

(Step 4206) The substrate automatic component placement unit 229B can place components on the substrate automatically, based on the connecting information between the substrate components and the mother board components in Step 4205.

(Step 4207) The automatic substrate configuration decision unit 228B finally decides the allocation which is temporary in Step 4203. But the allocation can be carried out later in time of laying out routing paths.

(Step 4208) If a plurality of substrates are used for placement, all of them are treated in the same way.

The following passages explain FIG. 42B. Next steps are taken.

(Steps 4211 and 4212) The operations of classifying components and deciding substrate configurations are the same as operations in FIG. 42.

(Step 4213) After deciding the substrate configuration, the substrate automatic component placement unit 229B places components on the substrate automatically.

(Step 4214) The terminals are allocated temporary on the substrate. The allocation is carried out ignoring the relationship between the substrate terminals and the mother board components. For example the terminals are allocated so that the length between the component terminal on the substrate and the substrate terminal becomes the shortest.

(Step 4215) All the substrates are treated in the above mentioned way.

(Step 4216) Each substrate is placed on the mother board automatically as well as the case in FIG. 42A.

(Step 4217) The automatic substrate configuration decision unit 228B decides the final allocation which is temporary in Step 4214. In this time, the terminals are changed and exchanged so that it makes it easy to lay out the routing paths later.

(Step 4218) All the substrates are treated in the same way as explained above.

FIG. 42B seems like the conventional designing methods, but it excels over the conventional methods in carrying out layout designing in view of the interconnection between the substrate and the mother board components.

<Automatic component classification unit 228A>

Figure 43:
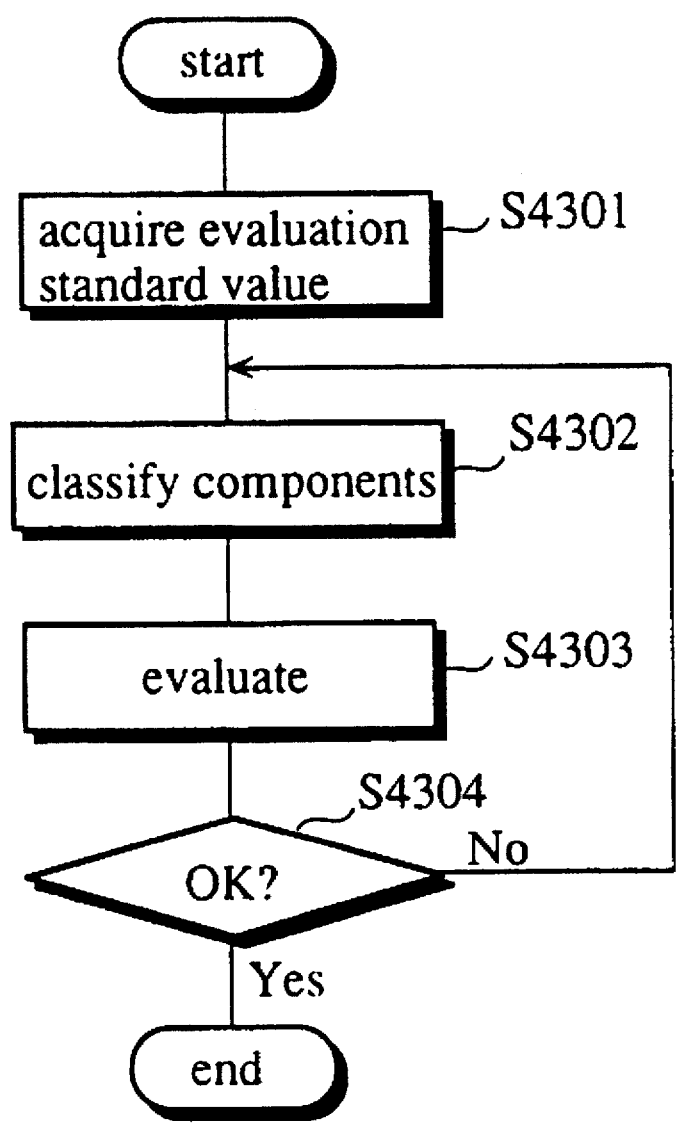
FIG. 43 is a flow chart which shows operations of an automatic component classification unit 228A.

FIG. 43 shows the operations. Next steps are taken.

(Step 4301) The evaluation standard values are inputted by the input unit 210. The evaluation standard values are values used as an indicator for classifying components such as, "reduce the cost below 100", "reduce the maximum component number below 6", "reduce the area needed for the component placement below 50" and the like. The evaluation standard values can be a plurality of kinds.

(Step 4302) Based on the inputted evaluation standard value, the automatic component classification unit 228A classifies the components into the components which are to be placed on the substrate and the components which are to be placed on the mother board.

(Step 4303) By comparing the value calculated by the total evaluation value calculation unit 224 and the evaluation standard value inputted in Steep 4301, it is judged whether the classification in Step 4302 satisfies the evaluation standard value.

Generally, the more components that are placed on the substrate, the higher the cost goes up. And the more components that are placed on the mother board, the more placement areas are needed.

(Step 4304) If the evaluation standard value is satisfactory, the component classification is adopted. If the value is not satisfactory, the component with problems is classified again and the same process is repeated.

Only the component with problems is changed onto the other circuit board. Also, all possible combinations can be evaluated successively.

<Automatic substrate configuration decision unit 228B>

Figure 44:
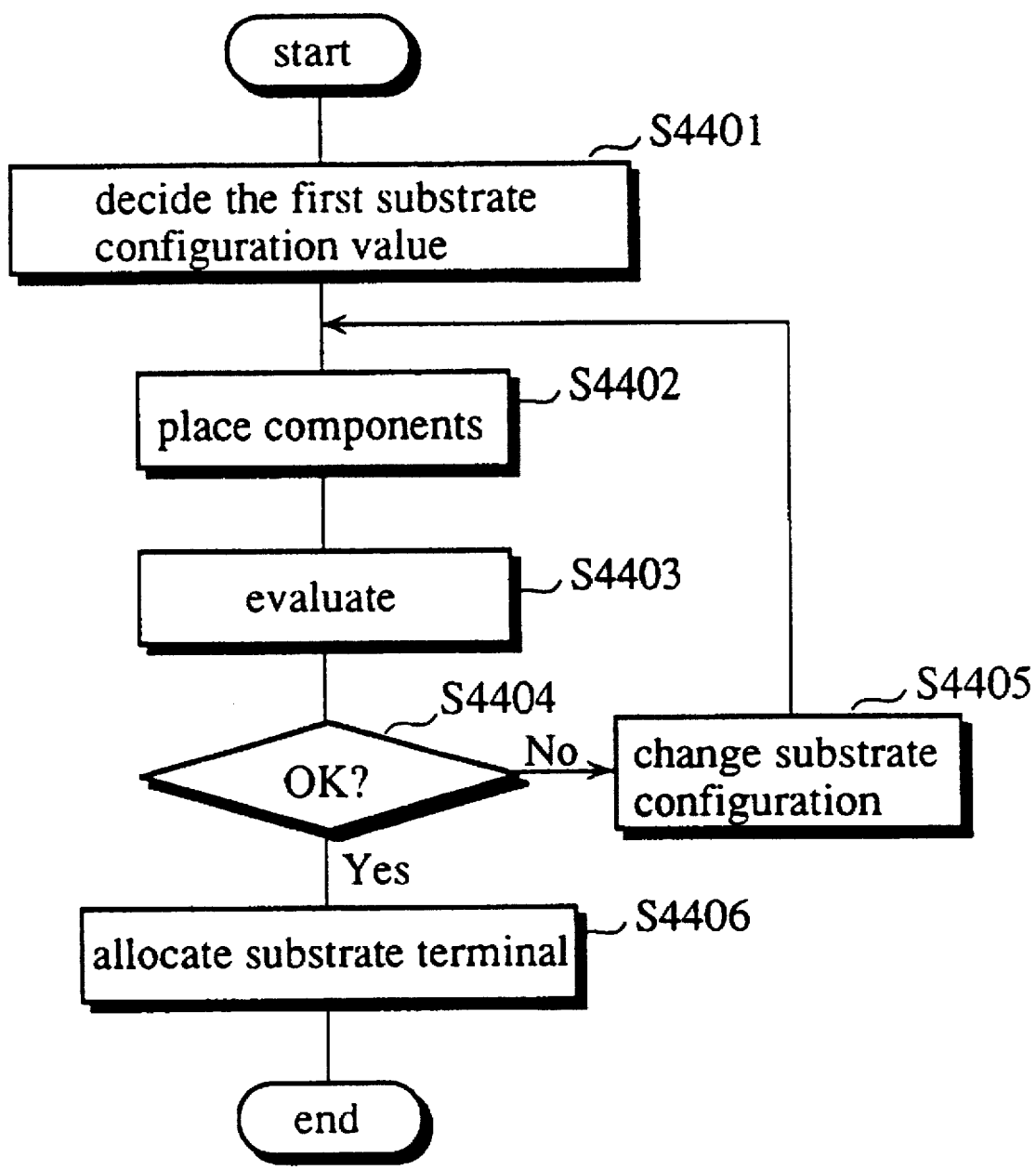
FIG. 44 is a flow chart which shows operations of an automatic substrate configuration decision unit 228B.

FIG. 44 explains the operations.

(Step 4401) The automatic substrate configuration 228B decides a substrate configurations as a first value. This first value is chosen from the already prepared configurations or generated anew by the conditions which are given by the designer.

(Step 4402) In view of only the interconnection between components to be placed on the substrate, components are placed automatically by a well-known method, not placing components too close to each other.

(Step 4403) It is evaluated whether all components are placed, routing areas among the components are enough, and the size of the circuit board configurations are appropriate.

(Step 4404) If the judgement of the evaluation is not satisfactory.

(Step 4405) the substrate configuration is changed, (Step 4404) and the components are placed again.

In Steps 4401–4405, areas are decided first and the components are placed afterward. But the components can be placed first.

(Step 4406) Lastly, terminals are allocated on the substrate so that the length of the nets become short and less nets cross with each other. If there's not enough information for the best terminal allocation, the terminals are allocated by order or allocated in the center of the substrate. But in those cases, when enough information for the terminal allocation is obtained, the terminals have to be allocated again. Of course, the terminal allocation can be carried out later in time of laying out routing paths.

<Mother board automatic component placement unit 229A>

Figure 45:
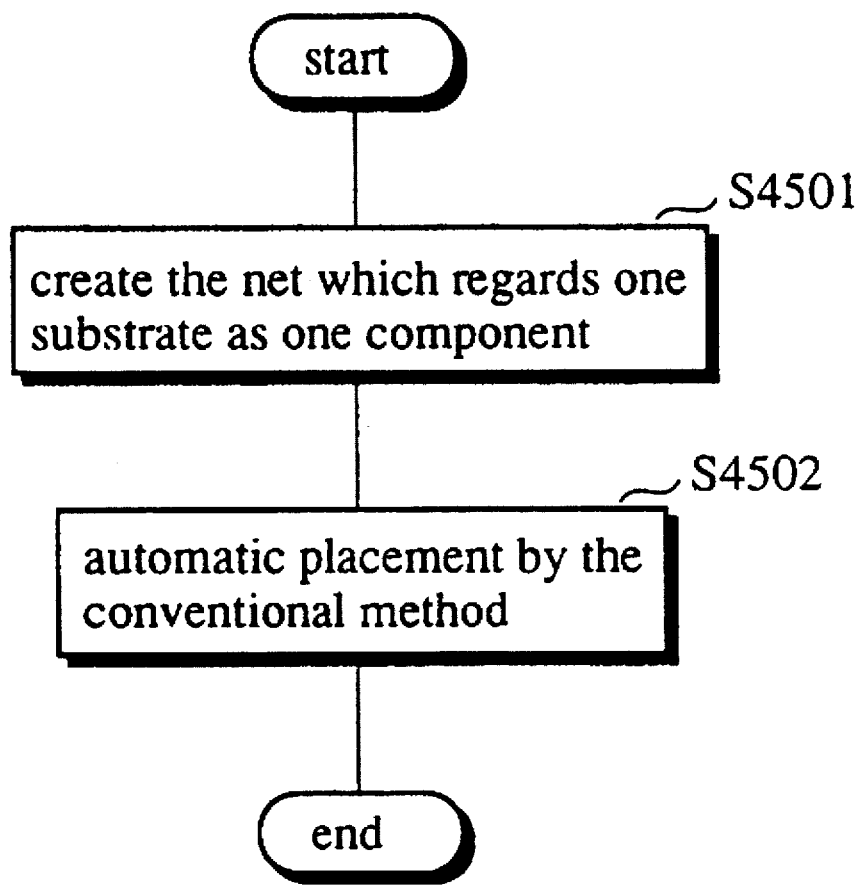
FIG. 45 is a flow chart which shows operations of a mother board automatic component placement unit 229A.

FIG. 45 shows the operations. Next steps are taken.

(Step 4501) The substrate automatic component placement unit 229A regards one substrate as one component on the mother board.

(Step 4502) Conventional automatic placement method for general components is used.

<Substrate automatic component placement unit 229B>

Figure 46:
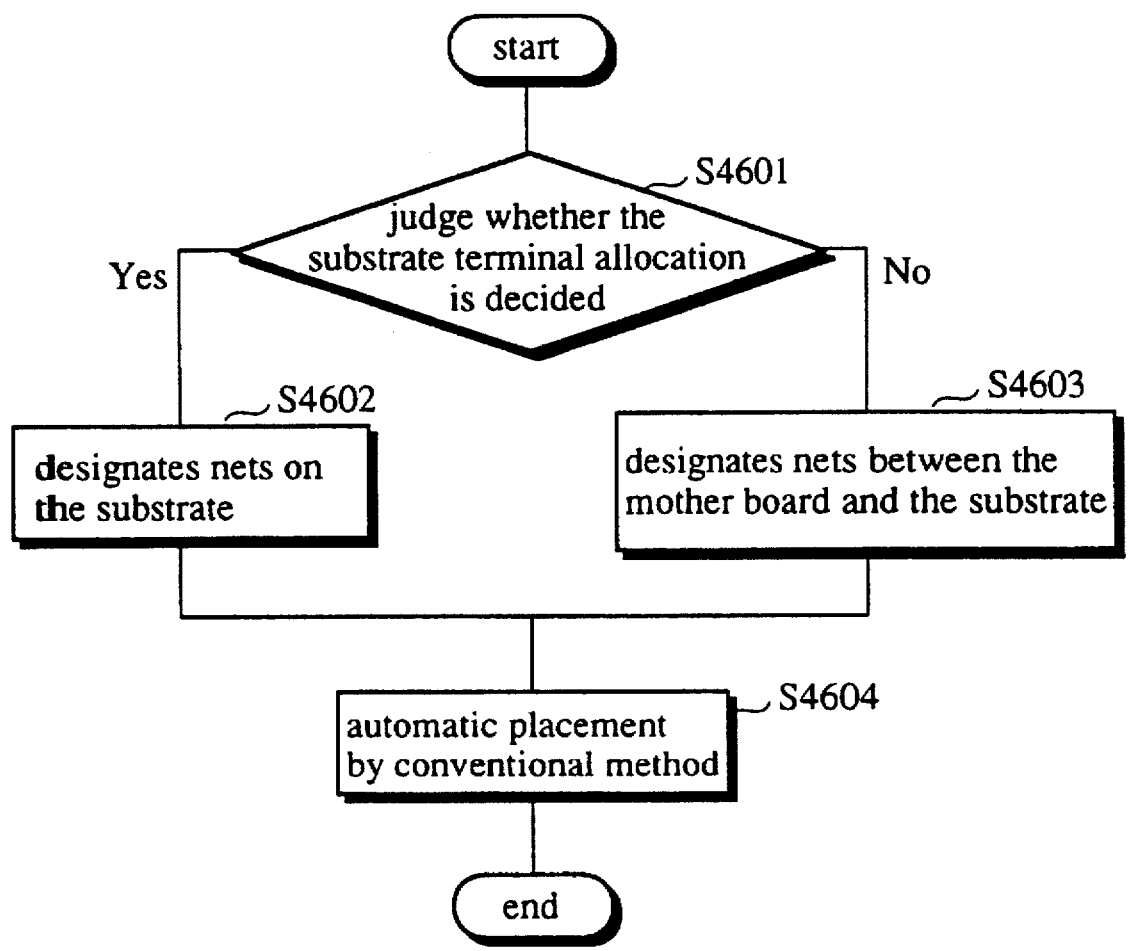
FIG. 46 is a flow chart which shows operations of a substrate automatic component placement unit 229B.

FIG. 46 shows the operations.

(Step 4601) The substrate automatic component placement unit 229B judges whether the substrate terminals are decided.

(Step 4602) If the terminals are already decided, all the nets to be used for interconnecting components which are to be placed automatically and the substrate components or the substrate terminals are designated.

(Step 4603) If the terminals are not decided, not only the substrate components, the mother board components and the substrate terminals which are to be used for automatic placement, but all the nets which are to be used for interconnecting the mother board components and other substrate components are designated.

(Step 4606) In view of all the designated nets, the components are placed on the substrate by the conventional automatic placement method.

<Example>

Figure 47:
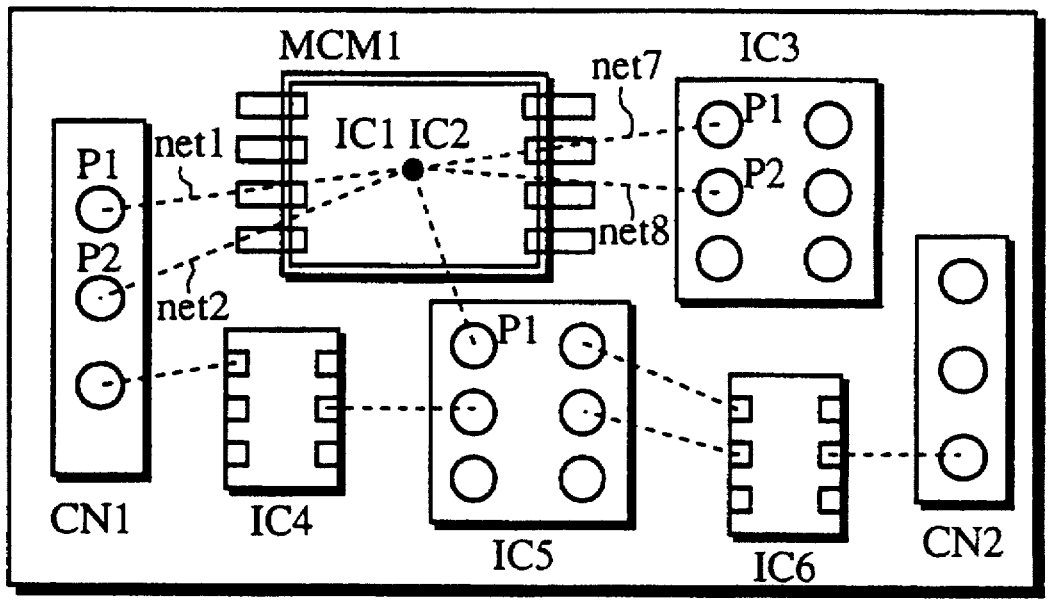
FIG. 47 is a display example of the layout data in case components are automatically placed on the mother board.

(Step 4205) FIG. 47 illustrates placing components on the mother board automatically. The terminal allocation is not yet decided finally on substrate MCM1, so all the nets to be interconnected with substrate MCM1 are allocated in the center of MCM1. That means the substrate terminals to be interconnected with each terminals on the components IC1 and IC2 on the substrate MCM1 are yet to be decided. All the terminals are supposed to be in the center of the substrate MCM1. So components are placed on the mother board automatically based on this presumption.

Substrate MCM1 is regarded as one component and treated in the same way as the other components IC3, IC4, IC5, and IC6. CN1 and CN2 are fixed because they are connectors.

As illustrated, the designer can place the substrate on the mother board automatically even if the terminals are not allocated on the substrate.

Figure 48:
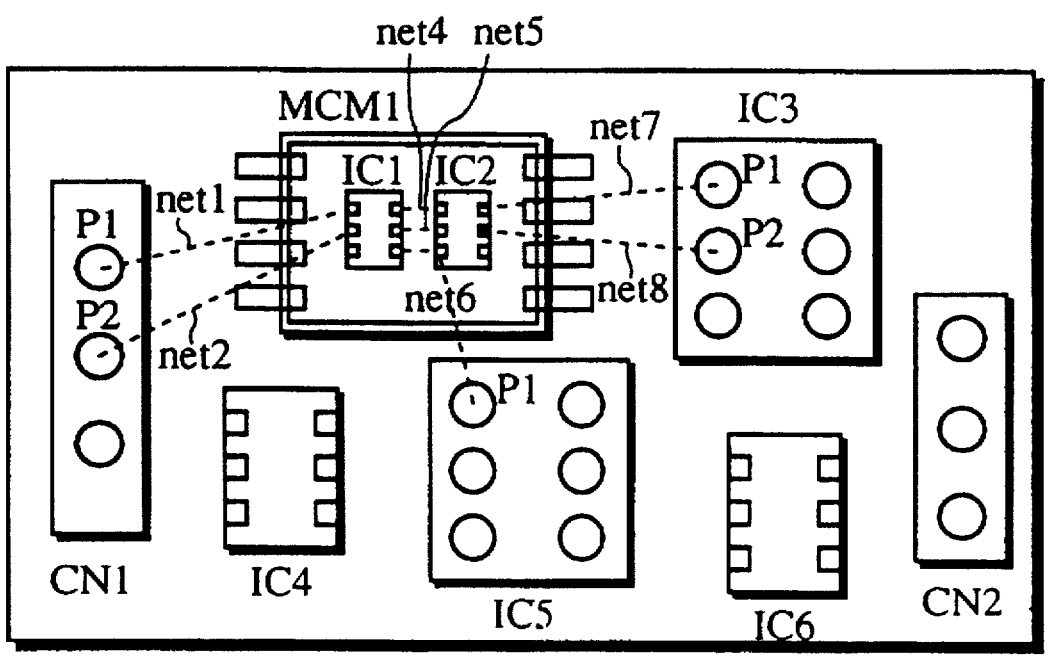
FIG. 48 is a display example of the layout data in case components are automatically placed on the substrate.

(Step 4207) FIG. 48 illustrates placing components on the substrate automatically. At this stage, the terminals are not allocated on the substrate MCM1 yet, but the general component terminals are already allocated. So by referring to the general component nets shown by dotted lines, components IC1 and IC2 are placed automatically. For example, component IC2 on the substrate is placed automatically in view of the interconnection between components IC3 and IC5 on the mother board and component IC1 on the substrate.

<Effects>

According to the present apparatus, components which are to be placed on the substrate and components which are to be placed on the mother board are classified automatically. The substrate configurations are decided and substrate terminals are allocated automatically. Moreover, the components are placed on the substrate and the mother board automatically.

Therefore, time needed for classifying and evaluating the components, setting the substrate areas, and placing components can be reduced greatly.

(Other effects)

The effects of the present apparatus are not limited to the above effects.

(1) Normally, different design rules are set for each circuit board. But in the present apparatus, a plurality of different design rule areas can be set on one circuit board.

Areas on the mother board which are set by the substrate placement unit 221B can be regarded as one area which has one design rule. After that, analogue areas and digital areas can be set on the mother board, and layout designing can be carried out for those areas at the same time.

(2) In Embodiment 1, nets are displayed in laying out routing paths, but the nets can be displayed at other times like time of placing components. That means, nets can be displayed for not only the components already placed on the circuit board but also for the components yet to be placed which are displayed outside the mother board. So the designer can place components in view of the interconnection between components.

Although the present apparatus has been fully described by way of examples with reference to the accompanying drawings, it is to be noted that various changes and modifications will be apparent to those skilled in the art. Therefore, unless such changes and modifications depart from the scope of the present apparatus, they should be construed as being included therein.

What is claimed is:

1. A layout designing apparatus for circuit boards including a mother board and a substrate which is placed thereon comprising:

layout data storage means for having areas to store data;

operation means for giving directions;

mother board setting means for creating data about the mother board in the layout data storage means according to the operation means;

substrate placement means for creating data in the layout data storage means according to the operation means so that the substrate of a given configuration is placed on a given place on the mother board;

component placement means for creating data in the layout data storage means according to the operation means so that components of predetermined configurations are placed on given places on the mother board and on the substrate;

routing means for creating data in the layout data storage means according to the operation means so that routing paths of given configurations are laid out on the mother board and on the substrate;

display means; and layout data display control means for controlling the display means to display configurations and places of the mother board, the substrate, components and routing paths as created.

2. The layout designing apparatus for circuit boards of claim 1, wherein the component placement means includes:

component configuration data storage unit for storing configurations and sizes of each component placed on the mother board and placed on the substrate;

circuit board judgement unit for judging whether each component is placed on the mother board and on the substrate by the operation means; and placement processing unit for reading from the component configuration data storage unit the component configuration and size based on the judgement of the circuit board judgement unit and editing the data in the layout data storage means so that a component having an appropriate configuration and size is placed on the circuit board designated by the operation means.

3. The layout designing apparatus of claim 1, further comprising:

evaluation value storage means for storing evaluation values for kinds, configurations and sizes of components and combinations of them;

total evaluation value calculation means for calculating a total evaluation value based on the evaluation values of the placed components; and total evaluation value display control means for controlling the display means to display the total evaluation value.

4. The layout designing apparatus of claim 3, wherein the total evaluation value calculation means calculates individual total evaluation value for each circuit board by totaling the evaluation value for components placed on each circuit board.

5. The layout designing apparatus of claim 1, wherein the routing means includes:

a mother board routing unit for creating the data in the layout data storage means according to the operation means so that the routing path interconnecting the component terminal on the mother board and the given substrate terminal is laid out on the mother board; and a substrate routing unit for creating the data in the layout data storage means according to the operation means so that the routing path interconnecting the given substrate terminal and the given component terminal on the substrate is laid out on the substrate.

6. The layout designing apparatus of claim 5, wherein the routing means further includes:

a routing judgement unit for judging whether the substrate terminal designated by the operation means is already used for the routing; and routing path deletion unit for editing the data in the layout data storage means, when the terminal has already been used for routing, so that the routing path for the terminal is deleted.

7. The layout designing apparatus of claim 1, further comprising:

equal substrate storage means;

equal substrate designation operation means for designating, from a plurality of substrates placed on the mother board, desired substrates with an equal attribute;

equal substrate setting means for storing information in the equal substrate storage means, the information identifying the substrates designated by the equal substrate designation operation means;

equal substrate judgement means for judging whether the substrate used for placement or routing according to the operation means is one of the equal substrates based on the information in the equal substrate storage means;

equal component placement means for editing the data in the layout data storage unit so that when the equal substrate judgement means judges that one of a plurality of equal substrates has components placed upon it, the counterpart components are placed on the same place of the rest of the equal substrates; and equal routing path layout means for editing the data in the layout data storage unit so that when the equal substrate judgement means judges that one of a plurality of equal substrates has routing path laid out upon it, the counterpart routing path is laid out on the same area of the rest of the substrates.

8. The layout designing apparatus of claim 1, further comprising:

net storage means for storing a plurality of nets, at least one of the nets has a component terminal on the mother board and a component terminal on the substrate, the component terminals are used for interconnection; and net display control means for controlling the display means to display lines interconnecting component terminals on the display means.

9. The layout designing apparatus of claim 8, wherein the net display control means controls the display means to display the lines corresponding to the nets designated by the operation means as broken lines via the substrate terminals designated by the operation means, at least one of the broken lines connect the component terminal on the mother board and the component terminal on the substrate.

10. The layout designing apparatus of claim 8, wherein the routing means includes:

net choice operation unit for choosing one net from the net storage means, one net being used for the interconnection between the component terminal on the mother board and the component terminal on the substrate;

substrate terminal storage unit for storing information which identifies the substrate terminals which are to be used for routing;

substrate terminal setting unit for setting information in the substrate terminal storage unit, the information identifying all the substrate terminals for the net chosen by the net choice operation unit based on the data in the layout storage means;

substrate routing judgment unit for choosing one substrate terminal from the substrate terminal storage unit and judging whether it is possible to lay out a routing path which interconnects the substrate terminal and the component terminal on the substrate for the nets chosen by the net choice operation unit;

mother board routing judgment unit for judging whether it is possible to lay out on the mother board the routing path between the substrate terminal chosen by the substrate routing judgment unit and the component terminal on the mother board;

routing repeat control unit for deleting, when at lease one of the substrate routing judgment unit and the mother board routing judgment unit judges an "impossible" condition for the chosen substrate terminal in the substrate terminal storage unit and operating so that the processing in the substrate routing judgment unit and the mother board routing judgment unit are repeated; and routing processing unit for editing the data in the layout data storage means, when the substrate routing judgment unit and the mother board routing judgment unit judge a "possible" condition, so that the routing paths are laid out on the mother board and on the substrate.

11. The layout designing apparatus of claim 1, further comprising;

evaluation value storage means for storing evaluation values of each component, the evaluation values which correspond to kinds, configurations, and sizes of the components and the combination of them;

upper bound evaluation value acquirement means for acquiring an upper bound evaluation value which can be a standard for classifying components;

component classification means for classifying all the components yet to be placed designated by the operation means into components which are to be placed on the substrate and components which are to be placed on the mother board;

total evaluation value calculation means for calculating the total evaluation value by reading and totaling, for each classified component, the evaluation value stored in the evaluation value storage means;

evaluation value judgement means for judging whether the total evaluation value is equal to the upper bound evaluation value or below;

component re-classification means for re-classifying, based on the evaluation values in the evaluation value storage means, the components yet to be placed so that the total evaluation value becomes closer to the upper bound evaluation value, when the evaluation value judgement means judges the total evaluation value is not equal to the upper bound evaluation value or below; and classification information display control means for operating so that the information about classification by the component classification means and component re-classification means is displayed on the display means.

12. The layout designing apparatus of claim 1, further comprising:

component configuration data storage means for storing each component configurations on the mother board and on the substrate;

component acquirement means for acquiring all the components which are to be placed on one substrate; and substrate configuration decision means for calculating the total occupied size based on a given rule according to the configurations of all the components acquired by the component acquirement means, deciding based on a given rule the size of the substrate which is bigger than and closest to the total occupied size, and editing the data in the layout data storage means to place the decided substrate on the mother board.

13. The layout designing apparatus of claim 1, further comprising:

mother board automatic component placement means for editing the data in the layout data storage means so that the substrate, on which components should be placed is decided, is regarded as one component and is placed on the mother board according to a given role.

14. The layout designing apparatus of claim 1, further comprises:

substrate automatic component placement means for editing the data in the layout data storage means , in view of the connection to the already placed other components on the circuit boards, so that the components designated by the operation means are placed on the substrate according to a given rule.

* * * * *